United States Patent
Choi et al.

(10) Patent No.: US 11,912,807 B2
(45) Date of Patent: Feb. 27, 2024

(54) COMPOSITE FOR SENSING HEAT OR INFRARED LIGHT AND DEVICE INCLUDING SAME

(71) Applicants: Samsung Electronics Co., Ltd., Suwon-si (KR); California Institute of Technology, Pasadena, CA (US)

(72) Inventors: Yeong Suk Choi, Suwon-si (KR); Tae Hyun Kim, Pasadena, CA (US); Linghui Wang, Pasadena, CA (US); Vincenzo Costanza, Pasadena, CA (US); Zhun Zhou, Pasadena, CA (US); Chiara Daraio, South Pasadena, CA (US)

(73) Assignees: Samsung Electronics Co., Ltd., Gyeonggi-do (KR); California Institute of Technology, Pasadena, CA (US)

( * ) Notice: Subject to any disclaimer, the term of this patent is extended or adjusted under 35 U.S.C. 154(b) by 492 days.

(21) Appl. No.: 17/211,134

(22) Filed: Mar. 24, 2021

(65) Prior Publication Data
US 2022/0056188 A1   Feb. 24, 2022

Related U.S. Application Data

(60) Provisional application No. 62/994,405, filed on Mar. 25, 2020.

(51) Int. Cl.
*C08F 293/00* (2006.01)
*C08K 3/04* (2006.01)
(Continued)

(52) U.S. Cl.
CPC ............ *C08F 293/005* (2013.01); *C08K 3/04* (2013.01); *G01J 5/20* (2013.01); *H10K 85/141* (2023.02);
(Continued)

(58) Field of Classification Search
CPC ...... C08F 293/00; C08F 293/005; C08F 8/12; C08K 3/04; C08L 53/00
See application file for complete search history.

(56) References Cited

U.S. PATENT DOCUMENTS

| 4,283,944 A | 8/1981 | Gruner et al. |
| 5,186,051 A | 2/1993 | Stecher et al. |

(Continued)

FOREIGN PATENT DOCUMENTS

| CN | 104075813 A | 10/2014 |
| CN | 104695227 A | 6/2015 |

(Continued)

OTHER PUBLICATIONS

Mikihiro Hayashi et al., "Mechanical Property Enhancement of ABA Block Copolymer-Based Elastomers by Incorporating Transient Cross-Links into Soft Middle Block", Macromolecules, American Chemical Society, 48(2), pp. 421-431, 2015, DOI: 10.1021/ma502239w.

(Continued)

*Primary Examiner* — Mark S Kaucher
(74) *Attorney, Agent, or Firm* — Harness, Dickey & Pierce, P.L.C.

(57) ABSTRACT

A composite for sensing heat or infrared light includes a block copolymer including a first structural group represented by Chemical Formula 1, a second structural group represented by Chemical Formula 2, and a third structural group represented by Chemical Formula 3; and a polyvalent metal ion that is coordinated with a side chain group of the block copolymer.

(Continued)

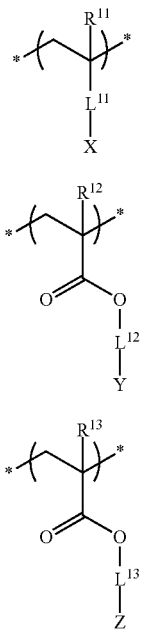

[Chemical Formula 1]

[Chemical Formula 2]

[Chemical Formula 3]

20 Claims, 9 Drawing Sheets

(51) Int. Cl.
G01J 5/20 (2006.01)
H10K 85/10 (2023.01)
H10K 30/30 (2023.01)
H10K 30/65 (2023.01)
H10K 39/32 (2023.01)

(52) U.S. Cl.
CPC ........ H10K 85/151 (2023.02); C08F 2438/03 (2013.01); C08F 2810/50 (2013.01); H10K 30/30 (2023.02); H10K 30/65 (2023.02); H10K 39/32 (2023.02)

(56) References Cited

U.S. PATENT DOCUMENTS

| | | | |
|---|---|---|---|
| 5,834,776 A | 11/1998 | Beratan et al. | |
| 6,174,953 B1 * | 1/2001 | Huybrechts | G06T 11/206 |
| | | | 524/840 |
| 6,497,902 B1 | 12/2002 | Ma | |
| 8,069,718 B2 | 12/2011 | Nakano et al. | |
| 8,895,076 B2 | 11/2014 | Kataoka et al. | |
| 9,243,943 B2 | 1/2016 | Moore et al. | |
| 9,274,004 B2 | 3/2016 | Yonemura et al. | |
| 10,090,466 B2 | 10/2018 | Chan et al. | |
| 10,345,153 B2 | 7/2019 | Daraio et al. | |
| 10,809,131 B2 | 10/2020 | Daraio et al. | |
| 11,255,870 B2 | 2/2022 | Bonanomi et al. | |
| 2006/0030685 A1 | 2/2006 | Passade Boupat et al. | |
| 2007/0295907 A1 | 12/2007 | Brott et al. | |
| 2010/0239621 A1 | 9/2010 | Tsujihata | |
| 2013/0269781 A1 | 10/2013 | Ko et al. | |
| 2013/0279538 A1 | 10/2013 | Beratan et al. | |
| 2013/0324697 A1 | 12/2013 | Stepanski et al. | |
| 2014/0030538 A1 | 1/2014 | Boutillier et al. | |
| 2014/0105242 A1 | 4/2014 | Fernandes et al. | |
| 2014/0267757 A1 | 9/2014 | Abramson et al. | |
| 2016/0178553 A1 | 6/2016 | Bommarito et al. | |
| 2018/0016407 A1 | 1/2018 | Landa et al. | |
| 2018/0038722 A1 | 2/2018 | Ozaki et al. | |
| 2018/0080830 A1 | 3/2018 | Daraio et al. | |
| 2019/0271597 A1 | 9/2019 | Daraio et al. | |
| 2019/0284349 A1 | 9/2019 | Bassett et al. | |
| 2019/0339298 A1 | 11/2019 | Bonanomi et al. | |
| 2020/0203762 A1 | 6/2020 | Park et al. | |
| 2021/0024657 A1 | 1/2021 | Choi et al. | |
| 2022/0056188 A1 | 2/2022 | Choi et al. | |
| 2022/0283198 A1 | 9/2022 | Bonanomi et al. | |
| 2023/0026770 A1 * | 1/2023 | Choi ......................... | G01J 5/20 |

FOREIGN PATENT DOCUMENTS

| | | |
|---|---|---|
| CN | 107690571 A | 2/2018 |
| CN | 107690571 B | 8/2020 |
| EP | 2676793 A1 | 12/2013 |
| EP | 02944858 B1 | 11/2015 |
| EP | 3073235 A1 | 9/2016 |
| EP | 3274677 A1 | 1/2018 |
| JP | H02232290 A | 9/1990 |
| JP | H09230126 A | 9/1997 |
| KR | 2017-0110664 A | 10/2017 |
| WO | WO-03/050522 A1 | 6/2003 |
| WO | WO-2016/151110 A1 | 9/2016 |
| WO | WO-2019/217328 A1 | 11/2019 |
| WO | WO-2020/120916 A1 | 6/2020 |

OTHER PUBLICATIONS

Jousheed Pennakalathil et al., "pH-Responsive Near-Infrared Emitting Conjugated Polymer Nanoparticles for Cellular Imaging and Controlled-Drug Delivery", Journal of Polymer Science, Part A: Polymer Chemistry, 53(9), pp. 114-122, 2015, DOI: 10.1002/pola.27458.

S. K. Varshney et al., "Synthesis of ABA Type Thermoplastic Elastomers Based on Polyacrylates", Macromolecules, 32(1), pp. 235-237. 1999.

David G. Hawthorne, et al., "Living Radical Polymerization with Reversible Addition-Fragmentation Chain Transfer (RAFT): Direct ESR Observation of Intermediate Radicals", Macromolecules, 32(16), pp. 5457-5459, 1999.

San H. Thang, et al., "A Novel Synthesis of Functional Dithioesters, Dithiocarbamates, Xanthates and Trithiocarbonates", Tetrahedron Letters, 40(12), pp. 2435-2438, 1999.

Hyun Uk Kang et al., "One-Step Synthesis of Block Copolymers Using a Hydroxyl-Functionalized Trithiocarbonate RAFT Agent as a Dual Initiator for RAFT Polymerization and ROP", Journal of Polymer Science Part A: Polymer Chemistry, 51(4), pp. 774-779, 2013, DOI: 10.1002/pola.26464.

U.S. Office Action dated May 27, 2022 for corresponding U.S. Appl. No. 16/404,543.

Alamusi et al. "Temperature-dependent piezoresistivity in an MWCNT/epoxy nanocomposite temperature sensor with ultrahigh performance," Nanotechnology, IOP Publishing, 2013, vol. 24, 455501, 6 pages.

Balberg, I. "Tunneling and Nonuniversal Conductivity in Composite Materials," Physical Review Letter, The American Physical Society, Sep. 21, 1987, vol. 59, No. 12, pp. 1305-1308, 4 pages.

Bockrath et al. "Luttinger-liquid behavior in carbon nanotubes," Nature, Macmillan Magazines Ltd., Feb. 18, 1999, vol. 397, pp. 598-601, 4 pages.

Caffall et al. "The structure, function, and biosynthesis of plant cell wall pectic polysaccharides," Carbohydrate Research, Elsevier, 2009, vol. 344, pp. 1879-1900, 22 pages.

Cardoso et al. "Temperature dependence of the formation and melting of pectin-Ca 2+ networks: A rheological study," Food Hydrocolloids, Elsevier 2003, vol. 17, pp. 801-807, 8 pages.

Choi et al. "Solvatochromism in single-walled carbon nanotubes," Applies Physics Letters, American Institute of Physics, 2007, vol. 90, No. 223114. pp. 223114-1-223114-3, 4 pages.

Cifuentes et al. "Biosynthesis of Callose and Cellulose by Detergent Extracts of Tobacco Cell Membranes and Quantification of the

(56) References Cited

OTHER PUBLICATIONS

Polymers Synthesized in vitro," Journal of Integrative Plant Biology, Chinese Academy of Sciences—Institute of Botany, 2010, vol. 52, No. 2, pp. 221-233, 13 pages.

Di Giacomo et al. "Bio-Nano-Composite Materials Constructed with Single Cells and Carbon Nanotubes: Mechanical, Electrical, and Optical Properties," IEEE Transactions on Nanotechnology, Institute of Electrical and Electronics Engineers, Nov. 2013, vol. 12, No. 6, pp. 1026-1030, 5 pages.

Di Giacomo et al. "Candida albicans/MWCNTs: a Stable Conductive Bio-Nano-Composite and its Temperature Sensing Properties," IEEE Transactions on Nanotechnology, Institute of Electrical and Electronics Engineers, Mar. 2013, vol. 12, No. 2, pp. 111-114, 4 pages.

Di Giacomo et al. "Investigation of multiwalled carbon nanotube interconnection geometry and electrical characteristics of an CNT-filled aluminum microgap," Canadian Journal of Physics, National Research Council Research Press, 2014, vol. 92, pp. 827-831, 5 pages.

Di Giacomo et al. "Plant nanobionic materials with a giant temperature response mediated by pectin-CA2+," Proceedings of the national Academy of Sciences of the United States of America, National Academy of Sciences, Apr. 14, 2015, vol. 112, No. 15, pp. 4541-4545, 5 pages.

European Search Report for EP Application No. EP15195729 filed on behalf of California Institute of Technology, dated Jul. 20, 2016, 1 Page.

Fensom, D.S. "A Note on Electrical Resistance Measurements in Acer Saccharum," Canadian Journal of Botany, NRC Research Press, 1960, vol. 38, No. 2, pp. 263-265, 5 pages.

Fensom, D.S. "On Measuring Electrical Resistance in SITU in Higher Plants," Canadian Journal of Plant Science, Agricultural Institute of Canada, Mar. 1966, vol. 46, pp. 169-175, 7 pages.

Fernandes et al. "Nanostructure of cellulose microfibrils in spruce wood," Proceedings of the National Academy of Sciences, National Academy of Sciences, Nov. 22, 2011, vol. 108, No. 47, pp. E1195-E1203, 9 pages.

First Chinese OA for Application No. 201680030032.3 filed Mar. 24, 2016 in the name of California Institute of Technology. dated Jan. 22, 2019, 22 pages. Chinese and English.

Giraldo et al. "Plant nanobionics approach to augment photosynthesis and biochemical sensing," Nature Materials, Nature Publishing Group, Apr. 2014, vol. 13, No. 2, pp. 400-408, 10 pages.

Guerette et al. "Accelerating the design of biomimetic materials by integrating RNA-seq with proteomics and materials science," Nature Biotechnology, Nature America Inc., Oct. 2013, vol. 31, No. 10, pp. 908-915, 11 pages.

Han et al. "Carbon Nanotube Based Humidity Sensor on Cellulose Paper," The Journal of Physical Chemistry C, American Chemical Society, 2012, vol. 116, pp. 22094-22097, 5 pages.

Hashimoto, T., et al., "Synthesis of Poly(Vinyl ether)-based, ABA Triblock-type Thermoplastic Elastomers with Functional Soft Segments and their Gas Permeability," Journal of Polymer Sci, Part A: Polymer Chem, 53(9); 1114-1124, Feb. 7, 2015.

Hawthorne, D.G et al., "Living Radical Polymerization with Reversible Addition-Fragmentation Chain Transfer (RAFT): Direct ESR Observation of Intermediate Radicals", Macromolecules 32 (16), 5457-5459, Jul. 22, 1999.

Hayashi, M., et al. "Mechanical Property Enhancement of ABA Block Copolymer-Based Elastomers by Incorporation Transient Cross-Links into Soft Middle Block," Macromolecules 48 (2); 421-31; Jan. 8, 2015.

Hu et al., "Localization of Boron in Cell Walls of Squash and Tobacco and Its Association with Pectin—Evidence for a Structural Role of Boron in the Cell Wall," Plant Physiology, American Society of Plant Biologists, 1994, vol. 105, pp. 681-689, 9 pages.

International Preliminary Report on Patentability for International Application No. PCT/EP2016/056642 filed on Mar. 24, 2016 on behalf of Eth Zurich. dated Sep. 26, 2017, 7 pages.

International Search Report and Written Opinion for International Application No. PCT/US2019/030941 filed on May 6, 2019 on behalf of California Institute of Technology. dated Aug. 23, 2019, 11 pages.

Itkis et al. "Bolometric Infrared Photoresponse of Suspended Single-Walled Carbon Nanotube Films," Science, American Association for the Advancement of Science. Apr. 21, 2006, vol. 312, pp. 413-416, 5 pages.

Itkis et al. "Thermal Conductivity Measurements of Semitransparent Single-Walled Carbon Nanotube Films by a Bolometric Technique," Nano Letters, American Chemical Society, 2007, vol. 7, No. 4, pp. 900-904, 5 pages.

Kaltenbrunner et al. "An ultra-lightweight design for imperceptible plastic electronics," Nature, Nature Publishing Group, Jul. 25, 2013, vol. 499, pp. 458-463, 9 pages.

Kamaya et al. "A lithium superionic conductor," Nature Materials, Macmillan Publishers Ltd, Sep. 2011, vol. 10, pp. 682-686, 5 pages.

Kang, H. U.; Yu, Y. C.; Shin, S. J.; Youk, J. H. "One-Step Synthesis of Block Copolymers Using a Hydroxyl-Functionalized Trithiocarbonate RAFT Agent as a Dual Initiator for RAFT Polymerization and ROP", Journal of Polymer Science Part A: Polymer Chemistry. 2013, 51, pp. 774-779.

Keplinger et al. "Stretchable, Transparent, Ionic Conductors," Science, American Association for the Advancement of Science, Aug. 30, 2013, vol. 341, pp. 984-987, 5 pages.

Kim et al. "Stretchable silicon nanoribbon electronics for skin prosthesis," Nature Communications, Macmillan Publishers Ltd. Dec. 9, 2014, vol. 5. No. 5747, pp. 1-11, 11 pages.

Leslie et al. "A bioinspired omniphobic surface coating on medical devices prevents thrombosis and biofouling," Nature Biotechnology, Nature America Inc. Nov. 2014, vol. 32, No. 11, pp. 1134-1140, 10 pages.

Li et al. "Continuum percolation of nanocomposites with fillers of arbitrary shapes," Applied Physics Letters, American Institute of Physics Publishing, 2007, vol. 90, No. 174108, pp. 174108-1-174108-3, 4 pages.

Li et al. "Direct Measurements of Interactions between Polypeptides and Carbon Nanotubes," Journal of Physical Chemistry B, American Chemical Society, 2006, vol. 110, No. 25, pp. 12621-12625, 5 pages.

Li et al. "Dominant role of tunneling resistance in the electrical conductivity of carbon nanotube-based composites," Applied Physics Letters, American Institute of Physics, 2007, vol. 91, pp. 223114-1-223114-3, 4 pages.

Matthews et al. "High-Temperature Behavior of Cellulose I," The Journal of Physical Chemistry B, American Chemical Society, 2011, vol. 115, pp. 2155-2166, 12 pages.

Mccrudden et al. "Microneedle applications in improving skin appearance," Experimental Dermatology, John Wiley & Sons Ltd. 2016, vol. 24, pp. 561-566, 6 pages.

Miguel et al. "Thermoresponsive chitosan-agarose hydrogel for skin regeneration," Carbohydrate Polymers, Elsevier, 2014, vol. 111, pp. 366-373, 9 pages.

Nadel et al. "Differential Thermal Sensitivity in the Human Skin," Pflugers Archive—European Journal of Physiology, Springer-Verlag, 1973, vol. 340, pp. 71-76, 7 pages.

Narayan et al. "Phase transition and critical issues in structure-property correlations of vanadium oxide," Journal of Applied Physics, American Institute of Physics, 2006, vol. 100, pp. 103524-1-103524-6, 7 pages.

Nawroth et al. "A tissue-engineered jellyfish with biomimetic propulsion," Nature Biotechnology, Nature Publishing Group, Aug. 2012, vol. 30, No. 8, pp. 792-797, 20 pages.

Neitzert et al. "Epoxy/MWCNT Composite as Temperature Sensor and Electrical Heating Element," IEEE Transactions on Nanotechnology, Institute of Electrical and Electronics Engineers, Jul. 2011, vol. 10, No. 4, pp. 688-693, 6 pages.

Nilsson et al. "Conductivity Percolation in Loosely Compacted Microcrystalline Cellulose: An in Situ Study by Dielectric Spectroscopy during Densification," The Journal of Physical Chemistry B, American Chemical Society, 2006, vol. 110, pp. 20502-20506, 5 pages.

(56) References Cited

OTHER PUBLICATIONS

Nilsson et al. "Mesopore Structure of Microcrystalline Cellulose Tables Characterized by Nitrogen Adsorption and SEM: The Influence on Water-Induced Ionic Conduction," Journal of Physical Chemistry B, American Chemical Society, 2006, vol. 110, pp. 15776-15781, 6 pages.

Nilsson et al. "Water-induced charge transport in tablets of microcrystalline cellulose of varying density: dielectric spectroscopy and transient current measurements," Chemical Physics, Elsevier, 2003, vol. 295, pp. 159-165, 7 pages.

Non-Final Office Action for U.S. Appl. No. 15/560,971, filed Sep. 22, 2017, on behalf of California Institute of Technology. dated Jun. 20, 2018, 9 pages.

Notice of Allowance for U.S. Appl. No. 15/560,971, filed Sep. 22, 2017, on behalf of California Institute of Technolgoy. dated Nov. 13, 2018, 10 pages.

Notice of Allowance for U.S. Appl. No. 15/560,971, filed Sep. 22, 2017 on behalf of California Institute of Technology. dated Feb. 22, 2019, 11 pages.

Peaucelle et al. "Cell wall mechanics and growth control in plants: the role of pectins revisited," Frontiers in Plant Science, Frontiers Media. Jun. 2012, vol. 33, No. 121, pp. 1-6, 6 pages.

Plazinski et al. "Molecular Basis of Calcium Binding by Polyguluronate Chains. Revising the Egg-Box Model," Journal of Computational Chemistry, Wiley Periodicals Inc. 2011. vol. 32. pp. 2988-2995, 8 pages.

Qi et al. "Unique water sensors based on carbon nanotube-cellulose composites," Sensors and Actuators B: Chemical, Elsevier. 2013. vol. 185, pp. 225-230, 6 pages.

Saha et al. "Hydrocolloids as thickening and gelling agents in food: a critical review," Journal of Food Science and Technology, Springer Nov.-Dec. 2010. vol. 47. No. 6. pp 587-597, 11 pages.

Second Chinese OA for Application No. 2016680030032.3 filed Mar. 24, 2015 in the name of California Institute of Technology. dated Jul. 5, 2019. 12 Pages. Original + Partial English Translation.

Segev-Bar et al. "Tunable Touch Sensor and Combined Sensing Platform: Toward Nanoparticle-based Electronic Skin," Applied Materials and Interfaces, American Chemical Society. 2013, vol. 5. 5531-5541, 20 pages.

Sheng, Ping, "Fluctuation-induced tunneling conduction in disordered materials," Physical Review B, The American Physical Society. Mar. 15, 1980. vol. 21, No. 6. pp 2180-2195, 16 pages.

Simmons, John G. "Generalized Formula for the Electric Tunnel Effect between Similar Electrodes Separated by a Thin Insulating Film," Journal of Applied Physics, American Institute of Physics, Jun. 1963, vol. 34, No. 6, pp. 1793-1803, 11 pages.

Sriamornsak, Pornsak. "Chemistry of Pectin and Its Pharmaceutical Uses: A Review," SUIC International Journal, Silpakorn University International College. 2003. vol. 3, pp. 206-228, 23 pages.

Stapleton et al. "Silicone Hydrogel Contact Lenses and the Ocular Surface," The Ocular Surface, Elsevier, Jan. 2006, vol. 4. No. 1. pp 24-43, 20 pages.

Sun et al. "Ionic Skin," Advanced Materials, Wiley-VCH Verlag Gmbh & Co. 2014. vol. 26. pp. 7608-7614, 7 pages.

Syllaios et al. "Amorphous Silicon Microbolometer Technology," Materials Research Society Symposium Proceedings, Materials Research Society. 2000. vol. 609. pp. A14.4.1-A14.4.6. 8 pages.

Tan et al. "Studies on toxicity of multi-walled carbon nanotubes on suspension rice cells," Carbon, Elsevier 2009. vol. 47. pp. 3479-3487, 9 pages.

Tee et al. "An electrically and mechanically self-healing composite with pressure- and flexion-sensitive properties for electronic skin applications," Nature Nanotechnology, Macmillan Publishers LTD. Dec. 2012. vol. 7, pp. 825-832, 8 pages.

Thang, S.H. et al., "A novel synthesis of functional dithioesters, dithiocarbamates, xanthates and trithiocarbonates," Tetrahedron Lett. 40 (12), 2435-2438, Mar. 19, 1999.

Thomas et al. "Structure of Cellulose Microfibrils in Primary Cell Walls from Collenchyma," Plant Physiology, American Society of Plant Biologists. Jan. 2013. vol. 161. pp. 465-476. 12 pages.

Van Buren, J.P. "Chapter 1: Function of Pectin in Plant Tissue Structure and Firmness," The Chemistry and Technology of Pectin, Academic Press Inc., 1991, pp. 1-23, 15 pages.

Varshney, S. K. et al., "Synthesis of ABA Type Thermoplastic Elastomers Based on Polyacrylates," Macromolecules 32 (1), 235-37, 1999.

Vay et al. "The thermo-TRP ion channel family: Properties and therapeutic implications," British Journal of Pharmacology, The British Pharmacological Society. 2012. vol. 165. pp. 787-801, 16 pages.

Vollmer et al. "Infrared Thermal Imaging: Fundamentals, Research and Applications," Viley-VCH Verlag Gmbh & Co. KGaA. 2010. pp. i-593, 611 pages.

Wang et al. "Nanostructured vanadium oxide thin film with high TCR at room temperature for microbolometer," Infrared Physics & Technology, Elsevier. 2013. vol. 57, pp. 8-13, 7 pages.

Willats et al. "Pectin: Cell biology and prospects for functional analysis," Plant Molecular Biology, Kluwer Academic Publishers, 2001. vol. 47, pp. 9-27, 20 pages.

Wilson, Mark. "Giant impacts may explain the origin of chondrules," Physics Today, American Institute of Physics. Mar. 2015. vol. 68, No. 15. pp. 14-17, 5 pages.

Written Opinion for International Application No. PCT/EP2016/056642, filed Mar. 24, 2016, on behalf of Eth Zurich. dated Jun. 27, 2016. 6 pages.

EP Communication pursuant to Article 94(3) EPC for EP Application No. EP16715264.4 filed on behalf of California Institute of Technology. dated Nov. 26, 2019, 5 pages.

Non-Final Office Action for U.S. Appl. No. 16/418,866, filed May 21, 2019 on behalf of California Institute of Technology. dated Apr. 2, 2020. 16 Pages.

Third Chinese Office Action for Application No. 201680030032.3 filed Mar. 24, 2016 in the name of California Institute of Technology. dated Mar. 16, 2020. 7 Pages.

Corrected Notice of Allowability for U.S. Appl. No. 16/418,866, filed May 21, 2019 on behalf of California Institute of Technology. dated Jul. 22, 2020. 2 Pages.

Final Office Action for U.S. Appl. No. 16/404,586, filed May 6, 2019 on behalf of California Institute of Technology. dated Jan. 26, 2021, 11 pages.

International Preliminary Report on Patentability for International Application No. PCT/US2019/030941 filed on May 6, 2019, on behalf of California Institute of Technology. dated Nov. 19, 2020. 8 pages.

Non-Final Office Action for U.S. Appl. No. 16/404,586, filed May 6, 2019 on behalf of California Institute of Technology. dated Dec. 1, 2020, 20 pages.

Notice of Allowance for U.S. Appl. No. 16/418,866, filed May 21, 2019 on behalf of California Institute of Technology. dated Jun. 4, 2020, 8 pages.

Notification of Intention to Grant for Chinese Application No. 201680030032.3 filed Mar. 24, 2016 in the name of California Institute of Technology. dated Jun. 30, 2020. CN Original + English Trans. 4 pages.

Advisory Action for U.S. Appl. No. 16/404,586, filed May 6, 2019 on behalf of California Institute of Technology. dated Apr. 19, 2021, 4 pages.

Aggarwal, J.K., et al., "Sensor Data Fusion in Robotic Systems", Control and Dynamic Systems, vol. 39, Part 1, pp. 435-462, 1991, 19 pages.

Aider, M. "Chitosan application for active bio-based films production and potential in the food industry: Review", LWT—Food Science and Technology. vol. 43, Issue 6, pp. 837-842, Jul. 2020. DOI: 10.1016/j.lwt.2010.01.021. 7 pages.

Andrade, J.R. et al. "Plasticized pectin-based gel electrolytes," Electrochimica Acta, 54, pp. 6479-6483, 2009. 5 pages.

Bandara, L.R. A.K. et al., "Ionic conductivity of plasticized (PEO)-LiCF3SO3 electrolytes", Electrochimica Acta, vol. 43, Nos. 10-11, pp. 1447-1451, 1998, 5 pages.

Bauer, S. "Sophisticated Skin", Flexible Electronics, Nature Materials, vol. 12, pp. 871-872, Oct. 2013, 3 pages.

(56) References Cited

OTHER PUBLICATIONS

Cabello, S.D.P., et al., "Influence of plasticizers in pectin films: Microstructural changes", Materials Chemistry and Physics, vol. 162, pp. 491-497, Jul. 15, 2015. 8 Pages. DOI: 10.1016/j. match. emphys.2015.06.019.

Cantarella, G., et al., "Design of Engineered Elastomeric Substrate for Stretchable Active Devices and Sensors", Advanced Functional Materials; vol. 28, Issue. 30, No. 1705132, Jul. 25, 2018, 10 Pages. DOI: 10.1002/adf.m.201705132.

Corrected Notice of Allowability for U.S. Appl. No. 16/404,586, filed May 6, 2019, on behalf of California Institute of Technology. dated Jan. 20, 2022. 4 Pages.

Chortos, A., et al. "Pursuing prosthetic electronic skin", Nature Materials, vol. 15, No. 9, pp. 937-950, Jul. 4, 2016. 15 Pages DOI: 10.1038/NMAT4671.

Costanza, V., et al., "Effect of glycerol on the mechanical and temperature-sensing properties of pectin films", Applied Physics Letters, vol. 115, No. 193702, 2019, 5 Pages. DOI: 10.1063/1. 5121710.

Da Silva, M.A. et al., "Alginate and pectin composite films cross-linked with Ca2+ ions: Effect of the plasticizer concentration", Carbohydrate Polymers, vol. 77, No. 4, pp. 736-742. Jul. 19, 2009, 16 Pages.

Di Giacomo, R., et al., "Biomimetic temperature-sensing layer for artificial skins", Science Robotics, vol. 2, Issue 3, eaai9251, pp. 1-6, Feb. 1, 2017, 8 Pages.

Fessas, D., et al., "Water properties in wheat flour dough I: Classical thermogravimetry approach", Food Chemistry, vol. 72, Issue 2, pp. 237-244, Feb. 2001. 9 Pages.

Gao, S., et al., "Temperature dependence of conductivity enhancement induced by nanoceramic fillers in polymer electrolytes", Applied Physics Letters, vol. 102, No. 173903, 2014, 6 Pages, DOI: 10.1063/1.4803185.

Huq, R., et al., "Influence of plasticizers on the electrochemical and chemical stability of a Li+ polymer electrolyte", Solid State Ionics, vol. 57, Issues 3-4, pp. 277-283, 1992, 8 Pages.

Jeon, J., et al., "Flexible Wireless Temperature Sensors Based on Ni Microparticle-Filled Binary Polymer Composites", Advanced Materials, vol. 25, pp. 850-855, 2013. 7 Pages. DOI: 10-1002/adma. 201204082.

U.S. Office Action dated Dec. 2, 2021 for corresponding U.S. Appl. No. 16/404,543.

Lodi, A, et al., "Physical properties and water state changes during storage in soy bread with and without almond", Food Chemistry, vol. 110, Issue 3, pp. 554-561, Oct. 2008. 9 Pages. DOI: 10.1016/j.foodchem.2008.02.032.

Machado, G.O., et al., "Influence of plasticizer contents on the properties of HEC-based solid polymeric electrolytes", Electrochimica Acta, vol. 50 (10), pp. 3827-3831, Jun. 2005. 6 Pages. DOI: 10-1016/j.al ecata.2005.02.041.

Mason, B.P., et al., "A temperature-mapping molecular sensor for polyurethane-based elastomers", Applied Physics Letters, vol. 108, No. 041906, 4 Pages, Jan. 27, 2016, DOI: 10.1063/1.4940750.

Masuda, Y., et al., "Study on ionic conductivity of polymer electrolyte plasticized with PEG-aluminate ester for rechargeable lithium ion battery", Solid State Ionics, vol. 177, issues 9-10, pp. 843-846, Mar. 2006. 5 pages. DOI: 10.1016/j.ssi.2006.01.049.

Ning, W., et al., "N, N-dimethylacetamide/lithium chloride plasticized starch as solid biopolymer electrolytes", Carbohydrate Polymers; vol. 77, Issue 3, pp. 607-611, Jul. 11, 2009, 6 Pages. DOI: 10.1016/j.carbpol.2009.02.002.

Non-Final Office Action for U.S. Appl. No. 16/935,300, filed Jul. 22, 2020 on behalf of Samsung Electronics Co., Ltd et al. dated Aug. 13, 2021, 14 Pages.

Non-Final Office Action for U.S. Appl. No. 16/404,586, filed May 6, 2019, on behalf of California Institute of Technology. dated Jun. 25, 2021. 10 Pages.

Notice of Allowance for U.S. Appl. No. 16/404,586, filed May 6, 2019, on behalf of California Institute of Technology. dated Oct. 22, 2021. 10 Pages.

Notice of Allowance for U.S. Appl. No. 16/404,586, filed May 6, 2019 on behalf of California Institute of Technology. Mdated Dec. 15, 2021. 7 Pages.

Nunez, C.G., et al., "Energy-Autonomous, Flexible and Transparent Tactile Skin", Advanced Functional materials, vol. 27, No. 1606287, 2017. 12 Pages. DOI: 10.1002/adfm.201606287.

Park, J. et al., "Fingertip skin-inspired microstructured ferroelectric skins discriminate static/dynamic pressure and temperature stimuli", nanomaterials, Science Advances. vol. 1, No. 9, el 500661, pp. 1-13, Oct. 30, 2015. 19 Pages.

Perez Espitia, P.J. et al., "Edible films from pectin: Physical-mechanical and antimicrobial properties—A review", Food Hydrocolloids, vol. 35, pp. 287-296, Mar. 2014. 11 Pages. DOI: 10.1016/j.foodhyd.2013.06.005.

Prajapati, G.K., et al., "Effect of plasticizer on ionic transport and dielectric properties of PVA-H3PO4 proton conducting polymeric electrolytes", Journal of Physics and Chemistry of Solids, vol. 71, 2010, pp. 1717-1723, 7 Pages. DOI: 10.1016/j.jpcs.2010.08.023.

Qian, X., et al., "Plasticizer effect on the ionic conductivity of PEO-based polymer electrolyte", Materials Chemistry and Physics, vol. 74, Issue 1, pp. 98-103, Feb. 2002, 7 Pages.

Saldo, J., et al., "Changes in water binding in high-pressure treated cheese, measured by TGA (thermogravimetrical analysis)," Innovative Food Science and Emerging Technologies, vol. 3, 2002, pp. 203-207. 6 Pages.

Trung, T.Q., et al., "An All-Elastomeric Transparent and Stretchable Temperature Sensor for Body-Attachable Wearable Electronics", Advanced materials, vol. 28, Issue 3, pp. 502-509, 2016, 9 Pages. DOI: 10-1002/adma.201504441.

Trung, TQ., et al., "Flexible and Stretchable Physical Sensor Integrated Platforms for Wearable Human Activity Monitoring and Personal Healthcare", Advanced Materials, vol. 28, No. 22, pp. 4338-4372, 2016, 36 Pages.

Varshney, P.K. et al., "Natural polymer-based electrolytes for electrochemical devices: a review", Ionics, vol. 17, 2011, pp. 479-483, 6 Pages. DOI: 10-1007/sl1581-011-0563-1.

Vieira, M.G.V., et al., "Natural-based plasticizers and biopolymer films: A review," European Polymer Journal, vol. 47, Issue 3, Mar. 2011, pp. 254-263, 27 Pages. DOI: 10-1016/j. eurpolymj.2010.12. 011.

Walker, C.W., et al., "Improvement of Ionic Conductivity in Plasticized PEO-Based Solid Polymer Electrolytes", J Electrochem. Soc., vol. 140, No. 12, Dec. 1993, pp. 3409-3412, 6 Pages.

Wang, X., et al., "Recent Progress in Electronic Skin", Advanced Science, vol. 2, No. 1500169. 2015, 21 Pages.

Wang, Y., et al., "Measurement of free water in foods by secondary derivative thermogravimetry", CyTA—Journal of Food, vol. 16, No. 1, 2018, pp. 438-443, 7 Pages. DOI: 10-1080/19476337.2017. 1416675.

Yokota, T, et al., "Ultraflexible, large-area, physiological temperature sensors for multipoint measurements", PNAS, vol. 112, No. 47, pp. 14533-14538, Nov. 24, 2015. DOI: 10.1073/pnas.1 51 56501 12.

Yu, C., et al., "A stretchable temperature sensor based on elastically buckled thin film devices on elastomeric substrates", Applied Physics Letters, vol. 95, No. 141912, Oct. 8, 2009. 5 Pages. DOI: 10.1063/1.3243692.

EP Communication pursuant to Article 94(3) EPC for EP Application No. EP16715264.4 filed on behalf of California Institute of Technology. dated Mar. 1, 2022. 4 Pages.

European Search Report and Written Opinion issued for EP Patent Application No. 15195729 filed on Nov. 20, 2015, on behalf of Eth Zurich. dated Jul. 27, 2016. Search Completed Jul. 20, 2016. 7 Pages.

Non-Final Office Action for U.S. Appl. No. 16/935,300, filed Jul. 22, 2020, on behalf of Samsung Electronics Co., Ltd. et al. dated Mar. 1, 2022. 13 Pages.

Notice of Allowance for U.S. Appl. No. 16/935,300, filed Jul. 22, 2020 on behalf of Samsung Electronics Co., Ltd. et al. dated Jul. 5, 2022. 9 Pages.

Notice of Allowance for U.S. Appl. No. 16/935,300, filed Jul. 22, 2020 on behalf of Samsung Electronics Co., Ltd. et al. dated Nov. 10, 2021. 7 Pages.

(56) References Cited

OTHER PUBLICATIONS

International Search Report dated Jun. 27, 2016 for corresponding International Application No. PCT/EP2016/056642.
Wei, Yuchun, et al., "Studies on the state of ion aggregation in thermoplastic IPN based on SBS and styrene-methacrylate ionomer", vol. 2, pp. 244-247 (1996).

* cited by examiner

COMPOSITE FOR SENSING HEAT OR INFRARED LIGHT AND DEVICE INCLUDING SAME

CROSS-REFERENCE TO RELATED APPLICATION

This application claims priority to and the benefit of U.S. Provisional Patent Application No. 62/994,405 filed in the United States Patent and Trademark Office on Mar. 25, 2020, the entire contents of which are incorporated herein based on reference.

BACKGROUND

1. Field

A composite for sensing heat or infrared light and a device including the same are disclosed.

2. Description of the Related Art

In digital cameras and camcorders, an imaging device that captures an image and stores it as an electrical signal is used, and the imaging device includes a sensor that decomposes incident light according to a wavelength and converts each component into an electrical signal.

In recent years, a device for sensing light in the infrared region for improving the sensitivity of a sensor in a low-light environment or for use as a biometric device has been studied.

SUMMARY

Some example embodiments provide a composite having improved heat and infrared light sensing characteristics.

Some example embodiments provide a device (photoelectric device, thermal sensing device, and electronic device) including the composite.

According to some example embodiments, a composite for sensing heat or infrared light includes a block copolymer including a first structural group represented based on represented based on Chemical Formula 1, a second structural group represented based on Chemical Formula 2, and a third structural group represented based on Chemical Formula 3; and a polyvalent metal ion that is coordinated with a side chain group of the block copolymer.

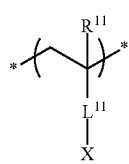

[Chemical Formula 1]

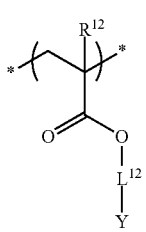

[Chemical Formula 2]

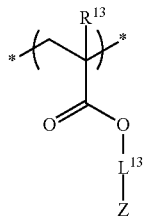

[Chemical Formula 3]

In Chemical Formulas 1 to 3, $R^{11}$, $R^{12}$, and $R^{13}$ are independently hydrogen or a C1 to C6 alkyl group, $L^{11}$ and $L^{12}$ are independently a single bond, a substituted or unsubstituted C1 to C10 alkylene group, a C2 to C20 alkylene group in which at least one methylene group is replaced by a linker selected from —O—, —S—, —C(=O)—, —S(=O)—, —S(=O)$_2$—, —C(=O)—O—, —O—C(=O)—, —C(=O)NR— (wherein R is hydrogen or a C1 to C6 alkyl group), or a combination thereof, and a substituted or unsubstituted C6 to C10 arylene group, $L^{13}$ is selected from a single bond, a substituted or unsubstituted C1 to C20 alkylene group, a substituted or unsubstituted C3 to C20 cycloalkylene group, and a substituted or unsubstituted C6 to C20 arylene group, X is a carboxyl group (—COOH), a sulfonic acid group ((—S(=O)$_2$OH), or a phosphoric acid group (—O—P(=O)(OH)$_2$), Y is selected from a hydroxy group (—OH), an alkoxy group (—OR, wherein R is a linear or branched C1 to C10 alkyl group), an ester group (C(=O)OR, wherein R is a linear or branched C1 to C10 alkyl group), a sulfonate ester group (—S(=O)$_2$OR, wherein R is a linear or branched C1 to C10 alkyl group), a phosphoric acid ester group (—O—P(=O)(OR)$_2$, wherein R is a linear or branched C1 to C10 alkyl group), an amine group, an isocyanate group (—N=C=O), and a urethane group (—NHC(=O)OR, wherein R is a linear or branched C1 to C10 alkyl group), and Z is selected from a substituted or unsubstituted linear or branch C1 to C20 alkyl group, a substituted or unsubstituted C6 to C30 aryl group, a substituted or unsubstituted C3 to C30 heteroaryl group, a substituted or unsubstituted C3 to C30 cycloalkyl group, and a substituted or unsubstituted C3 to C30 heterocycloalkyl group.

The block copolymer may include a hydrophilic block (A) and a hydrophobic block (B). The block copolymer may include a linking group (L) between the hydrophilic block (A) and the hydrophobic block (B) and the linking group may include trithiocarbonate, dithiocarbonate, xanthate, or a combination thereof.

The hydrophilic block (A) and the hydrophobic block (B) may be symmetrically or asymmetrically present in the block copolymer with respect to the linking group (L).

The hydrophilic block (A) may include two or more first structural groups and two or more second structural groups, each of which may be in a form of block copolymerization, random copolymerization or alternating copolymerization. The hydrophobic block (B) may include two or more third structural groups, which may be in the form of block copolymerization, random copolymerization or alternating copolymerization.

In the block copolymer, a sum amount of the first structural unit and the second structural unit may be included in about 2 moles to about 50 moles relative to 100 moles of the third structural unit in the composite.

The block copolymer may have a weight average molecular weight of greater than or equal to about 5,000.

The block copolymer may be included in the composite in an amount of greater than or equal to about 20 volume % and less than or equal to about 99.9 volume % based on a total volume of the composite for sensing heat or infrared light. In some example embodiments, the block copolymer may be included in the composite in an amount of greater than or equal to about 70 volume % and less than or equal to about 99 volume % based on a total volume of the composite for sensing heat or infrared light. In some example embodiments, the block copolymer may be included in the composite in an amount of greater than or equal to about 20 volume % and less than or equal to about 50 volume % based on a total volume of the composite for sensing heat or infrared light.

The polyvalent metal ion may be a divalent or higher metal ion. Specific examples of the polyvalent metal ion may include an ion of a metal selected from Ca, Al, Cu, Co, Ba, Zn, Fe, Mn, Mg, Sr, Ba, Cr, Ti, Zr, Mo, V, and a combination thereof.

The polyvalent metal ion may be included in the composite in an amount of greater than or equal to about 0.1 volume % and less than or equal to about 80 volume % based on a total volume of the composite for sensing heat or infrared light. In some example embodiments, the polyvalent metal ion may be included in the composite in an amount of greater than or equal to about 1 volume % and less than or equal to about 30 volume % based on a total volume of the composite for sensing heat or infrared light. In some example embodiments, the polyvalent metal ion may be included in the composite in an amount of greater than or equal to about 50 volume % and less than or equal to about 80 volume % based on a total volume of the composite for sensing heat or infrared light.

The composite for sensing heat or infrared light may further include a reinforcing agent, and the reinforcing agent may further include graphite, carbon nanotubes, graphene, graphite nanoplates, fullerene, fullerene derivatives, quantum dots, metal oxides, or a combination thereof.

The reinforcing agent may be included in an amount of less than or equal to about 5 volume % based on a total volume of the composite for sensing heat or infrared light.

According to some example embodiments, a photoelectric device, a thermal sensing device, and an electronic device including the composite for sensing heat or infrared light is provided.

The composite for sensing heat or infrared light may improve elongation while maintaining improved charge mobility and electrical properties, and thus may be usefully applied to electronic devices requiring high stretchability and healing ability.

DETAILED DESCRIPTION

Figure 1:
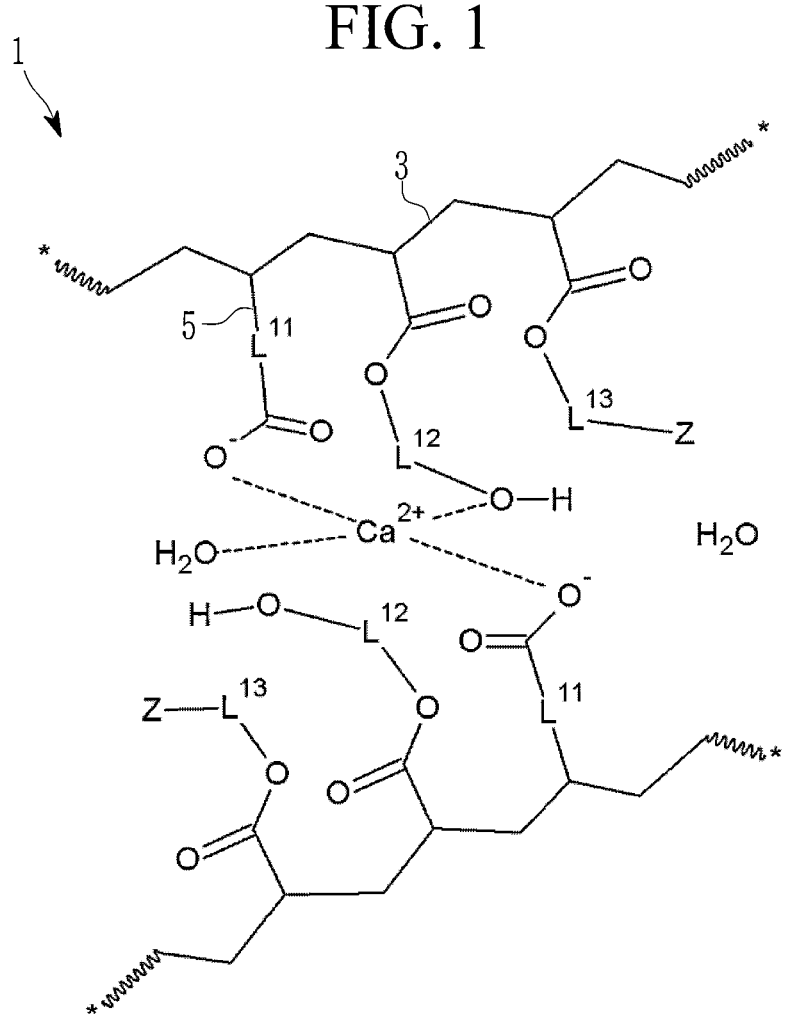
FIG. 1 is a view showing a coordination bonding state of a block copolymer and a polyvalent metal ion constituting a composite.

Advantages and features of the technology described hereinafter, and a method of achieving them will be clarified based on referring to some example embodiments described below in detail together with the accompanying drawings. However, the example embodiments should not be construed as being limited to the example embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. Terms defined in a commonly used dictionary may be interpreted as having meanings consistent with their meanings in the related technical field and the context of the present specification, and may not be interpreted as idealized and excessively formal meanings, unless specifically defined herein. In addition, unless explicitly described to the contrary, the word "comprise", and variations such as "comprises" or "comprising," will be understood to imply the inclusion of stated elements but not the exclusion of any other elements.

Further, the singular includes the plural unless mentioned otherwise.

In the drawings, the thickness is enlarged to clearly represent various layers and regions. The same reference numerals are used for similar portions throughout the specification.

In the present specification, when a first element such as a layer, film, region, plate, etc. is said to be "on" the second element, this includes not only the case of being "directly on" the other portion but also another portion in the middle (e.g., being "indirectly on" the other portion). In contrast, when an element is referred to as being "directly on" another element, there are no intervening elements present. It will be understood that an element that is "on" another element may be "above" or "beneath" the other element.

As used herein, when a definition is not otherwise provided, "substituted" refer to replacement of hydrogen of a compound or a functional group by a substituent selected from a halogen atom, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C1 to C20 alkoxy group, a C1 to C20 haloalkyl group, a C2 to C20 alkenyl group, a C2 to C20 alkynyl group, a C6 to C30 aryl group, a C7 to C30 arylalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

In addition, when a definition is not otherwise provided, "hetero" means that one or three heteroatoms selected from N, O, S, Si, Se, Te, and P are included in a given group or compound.

Hereinafter, "combination" includes two or more mixing, two or more lamination structures, or inter-substitution.

It will be understood that any elements and/or properties thereof as described herein (e.g., amounts) should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

It will be understood that some or all of any of the devices according to any of the example embodiments as described herein may be included in, may include, and/or may be implemented based on one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the devices according to any of the example embodiments as described herein, including any of the methods of operating any of same.

As used herein, "(meth)acrylate" may mean both acrylate and methacrylate.

Hereinafter, a composite for sensing heat or infrared light according to some example embodiments is described.

A composite (also referred to interchangeably as a composite material or composite compound) for sensing heat or infrared light according to some example embodiments includes a block copolymer including a first structural unit (e.g., first structural group) represented by Chemical Formula 1, a second structural unit (e.g., second structural group) represented by Chemical Formula 2, and a third structural unit (e.g., third structural group) represented by Chemical Formula 3; and a polyvalent metal ion that coordinates with (e.g., is coordinated with) a side chain group of the block copolymer.

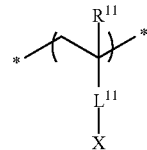

[Chemical Formula 1]

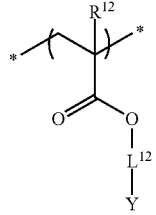

[Chemical Formula 2]

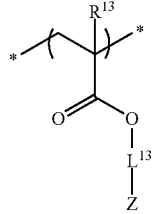

[Chemical Formula 3]

In Chemical Formulas 1 to 3, $R^{11}$, $R^{12}$, and $R^{13}$ are independently hydrogen or a C1 to C6 alkyl group, $L^{11}$ and $L^{12}$ are independently a single bond, a substituted or unsubstituted C1 to C10 alkylene group, a C2 to C20 alkylene group in which at least one methylene group is replaced by a linker selected from —O—, —S—, —C(=O)—, —S(=O)—, —S(=O)$_2$—, —C(=O)—O—, —O—C(=O)—, —C(=O)NR— (wherein R is hydrogen or a C1 to C6 alkyl group), or a combination thereof, and a substituted or unsubstituted C6 to C10 arylene group, $L^{13}$ is selected from a single bond, a substituted or unsubstituted C1 to C20 alkylene group, a substituted or unsubstituted C3 to C20 cycloalkylene group, and a substituted or unsubstituted C6 to C20 arylene group, X is a carboxyl group (—COOH), a sulfonic acid group ((—S(=O)$_2$OH), or a phosphoric acid group (—O—P(=O)(OH)$_2$), Y is selected from a hydroxy group (—OH), an alkoxy group (—OR, wherein R is a linear or branched C1 to C10 alkyl group), an ester group (C(=O)OR, wherein R is a linear or branched C1 to C10 alkyl group), a sulfonate ester group (—S(=O)$_2$OR, wherein R is a linear or branched C1 to C10 alkyl group), a phosphoric acid ester group (—O—P(=O)(OR)$_2$, wherein R is a linear or branched C1 to C10 alkyl group), an amine group, an isocyanate group (—N=C=O), and an urethane group (—NHC(=O)OR, wherein R is a linear or branched C1 to C10 alkyl group), and Z is selected from a substituted or unsubstituted linear or branch C1 to C20 alkyl group, a substituted or unsubstituted C6 to C30 aryl group, a substituted or unsubstituted C3 to C30 heteroaryl group, a substituted or unsubstituted C3 to C30 cycloalkyl group, and a substituted or unsubstituted C3 to C30 heterocycloalkyl group.

In the block copolymer, X of the first structural unit may dissociate H to form an anionic group, and Y of the second structural unit may be a hydrophilic functional group. The anionic group of the first structural unit and the hydrophilic functional group of the second structural unit of the block copolymer form coordinated bonds with polyvalent metal ions based on electrostatic interactions to form a crosslinked polymer network. For example, oxygen (O) or nitrogen (N) of the second structural unit may form hydrogen bonding with the polyvalent metal ions. X of the first structural unit and Y of the second structural unit are charged moieties, forming a hydrophilic region with increased intermolecular attraction of the polymer chain via the polyvalent metal ions, and the hydrophilic region may retain water molecules. When water is included in the polymer network, charge mobility and temperature responsivity may be improved.

The third structural unit may function (e.g., may be configured to function) so that the block copolymer forms a polymer network with each other based on hydrophobic interactions, and the first structural unit and the second structural unit have an arrangement for forming coordination bonds with the polyvalent metal ions.

The structure of the polymer network is shown in FIG. 1 when X of the first structural unit is a carboxyl group, Y of the second structural unit is a hydroxyl group, and the polyvalent metal ion is $Ca^{2+}$.

FIG. 1 is a view showing a coordination bonding state of a block copolymer 3 and a polyvalent metal ion in a composite 1 for sensing heat or infrared light according to some example embodiments.

The polymer network as described above may be configured function so that the polymer chain and polyvalent metal ions of the polymer network are rearranged according to the ambient conditions (e.g., temperature, infrared light, etc.), and thus high charge mobility in the composite 1 for sensing heat or infrared light including the same may be provided, thereby improving conductivity of the composite 1 for sensing heat or infrared light.

The block copolymer 3 may include a hydrophilic block (A) and the block copolymer may further include a hydrophobic block (B). The hydrophilic block (A) may include a first structural unit (e.g., first structural group) and a second structural unit (e.g., second structural group), and hydrophobic block (B) may include a third structural unit (e.g., third structural group).

The block copolymer 3 may be an ABA triblock copolymer including a hydrophilic block (A), a hydrophobic block (B), and a hydrophilic block (A).

A linker (L) selected from trithiocarbonate, dithiocarbonate, xanthate, or a combination thereof may be further included between the hydrophilic block (A) and the hydrophobic block (B). In the block copolymer 3, the hydrophilic block (A) and the hydrophobic block (B) may be symmetrically or asymmetrically present (e.g., present in the block copolymer 3) with respect to the linking group (L). When the hydrophilic block (A) and the hydrophobic block (B) are symmetrically present, the block copolymer 3 may have an AB-L-BA structure, and when the hydrophilic block (A) and the hydrophobic block (B) are asymmetrically present, it may have an AB-L-AB structure.

The block copolymer 3 may include a plurality of block structural units (e.g., block structural groups), and each block structural unit may include the aforementioned first to third structural units described above.

The hydrophilic block (A) may include two or more first structural units (e.g., two or more first structural groups) and two or more second structural units (e.g., two or more second structural groups), and the two or more first structural units and two or more second structural units may each be in the form of block copolymerization, random copolymerization or alternating copolymerization. The hydrophobic block (B) may include two or more third structural units (e.g., two or more third structural groups), which may be in the form of block copolymerization, random copolymerization or alternating copolymerization.

In the block copolymer 3, a sum amount of the first structural unit and the second structural unit in the composite 1 may be about 2 moles to about 50 moles relative to 100 moles of the third structural unit in the composite 1. That is, the hydrophilic block (A) may be included in about 2 moles to about 50 moles relative to 100 moles of the hydrophobic block (B) in the composite 1. In some example embodiments, the sum amount of the first structural unit and the second structural unit may be greater than or equal to about 2.5 moles, greater than or equal to about 3 moles, greater than or equal to about 3.5 moles, greater than or equal to about 4 moles, greater than or equal to about 4.5 moles, or greater than or equal to about 5 moles and less than or equal to about 49 moles, about 48 moles, less than or equal to about 47 moles, less than or equal to about 46 moles, less than or equal to about moles, less than or equal to about 44 moles, less than or equal to about 43 moles, less than or equal to about 42 moles, less than or equal to about 41 moles, or less than or equal to about 40 moles relative to 100 moles of the third structural unit. The block copolymer 3 may have a weight average molecular weight (Mw) of greater than or equal to about 5,000, for example greater than or equal to about 6000, greater than or equal to about 7000, greater than or equal to about 8000, greater than or equal to about 9000, or greater than or equal to about 10000 and less than or equal to about 1,500,000, less than or equal to about 1,600,000, less than or equal to about 1,700,000, less than or equal to about 1,800,000, less than or equal to about 1,900,000, or less than or equal to about 2,000,000. When used in the above ranges, the coating property of the composition for preparing the composite 1 for sensing heat or infrared light may be easily adjusted. The weight average molecular weight of the block copolymer is measured based on gel permeation chromatography (hereinafter, referred to as "GPC") method and may be obtained based on polystyrene conversion.

A molecular weight distribution (PDI) of the block copolymer 3 may be less than about 2.0, less than or equal to about 1.9, less than or equal to about 1.8, or less than or equal to about 1.7. The molecular weight distribution (PDI) is obtained based on (weight average molecular weight (Mw) of block copolymer)/(number average molecular weight (Mn) of block copolymer). As the PDI is smaller, a copolymer having the narrower molecular weight distribution and aligned molecular weight, and when the value is 1.0, the narrowest molecular weight distribution is obtained.

The content of the block copolymer 3 forming the polymer network in the composite 1 (e.g., the amount of the block copolymer included in the composite 1) may be greater than or equal to about 20 volume %, for example greater than or equal to about 25 volume %, greater than or equal to about 30 volume %, greater than or equal to about 35 volume %, greater than or equal to about 40 volume %, greater than or equal to about 45 volume %, greater than or equal to about 50 volume %, greater than or equal to about 55 volume %, or greater than or equal to about 60 volume % based on a total volume of the composite 1 for sensing heat or infrared light. In addition, the content of the block copolymer in the composite 1 may be less than or equal to about 99.9 volume %, for example less than or equal to about 99 volume %, less than or equal to about 95 volume %, less than or equal to about 90 volume %, less than or equal to about 85 volume %, or less than or equal to about 80 volume % based on a total volume of the composite 1 for sensing heat or infrared light. Within the above ranges, mechanical and electrical properties of the composite 1 for sensing heat or infrared light may be easily controlled.

The polyvalent metal ion may form a coordination bond based on electrostatic interaction with the side chain 5 of the block copolymer. The polyvalent metal ion may be a divalent or higher metal ion, for example, a divalent, trivalent, or tetravalent metal ion. Specific examples of the polyvalent metal ion include ions of metals including Ca, Al, Cu, Co, Ba, Zn, Fe, Mn, Mg, Sr, Ba, Cr, Ti, Zr, Mo, V, or a combination thereof.

A content of the polyvalent metal ion in the composite (e.g., an amount of the polyvalent metal ion in the composite) may be greater than or equal to about 0.1 volume %, for example greater than or equal to about 0.2 volume %, greater than or equal to about 0.3 volume %, greater than or equal to about 0.4 volume %, or greater than or equal to about 0.5 volume % based on a total volume of the composite for sensing heat or infrared light. In addition, the content of the polyvalent metal ion in the composite may be less than or equal to about 80 volume %, for example less than or equal to about 75 volume %, less than or equal to about 70 volume %, less than or equal to about 65 volume %, less than or equal to about 60 volume %, less than or equal to about 55 volume %, less than or equal to about 50 volume %, or less than or equal to about 45 volume % based on a total volume of the composite for sensing heat or infrared light. Within the ranges, flexibility, stretchability, and electrical properties of the composite for sensing heat or infrared light may be improved.

In some example embodiments, each content of the block copolymer and the polyvalent metal ion in the composite may be adjusted according to the flexibility of the substrate of the device. For example, in the case of a device including a flexible substrate, the content of the block copolymer in the composite may be increased, and in the case of a rigid substrate, the content of the block copolymer in the composite may be lowered. In the case of a flexible substrate, a content of the block copolymer in the composite may be greater than or equal to about 70 volume %, for example greater than or equal to about 75 volume %, or greater than or equal to about 80 volume % and less than or equal to about 99 volume %, for example less than or equal to about 95 volume %, or less than or equal to about 90%, based on a total volume of the composite for sensing heat or infrared light and a content of the polyvalent metal ion may be greater than or equal to about 1 volume %, for example greater than or equal to about 5 volume %, or greater than or equal to about 10 volume % and less than or equal to about 30 volume %, for example less than or equal to about 25 volume %, or less than or equal to about 20% based on a total volume of the composite for sensing heat or infrared light. In the case of a rigid substrate, a content of the block copolymer in the composite may be greater than or equal to about 20 volume %, for example greater than or equal to about 25 volume %, or greater than or equal to about 30 volume % and less than or equal to about 50 volume %, for example less than or equal to about 45 volume %, or less than or equal to about 40%, and a content of the polyvalent metal ion may be greater than or equal to about 50 volume %, for example greater than or equal to about 55 volume %, or greater than or equal to about 60 volume % and less than or equal to about 80 volume %, for example less than or equal to about 75 volume %, or less than or equal to about 70% based on a total volume of the composite for sensing heat or infrared light.

The block copolymer may be prepared based on mixing a first vinyl-based monomer providing a first structural unit and a second vinyl-based monomer providing a second structural unit with a chain transfer agent and a living free radical initiator to polymerize the first and second vinyl-based monomers and then, mixing a third vinyl-based monomer providing a third structural unit with the living free radical initiator to polymerize the third vinyl-based monomer. Accordingly, a mole ratio of hydrophilic blocks (A) and hydrophobic blocks (B) in the composite may be easily adjusted.

A method of obtaining the block copolymer is not particularly limited but may be synthesized in a living free radical polymerization (LFRP) method such as an atom transfer radical polymerization (ATRP) method, a nitroxide-mediated polymerization (NMP) method, or a reversible addition-fragmentation chain transferpolymerization (RAFT) method, and the like.

The first vinyl monomer may be a vinyl-based monomer including functional groups such as a carboxyl group, a sulfonic acid group, or a phosphoric acid group of the first structural unit and the like or these functional groups protected by a protecting group (e.g., a t-butyl group). Specific examples of the first vinyl-based monomer may include monomer obtained based on reacting crotonic acid, maleic acid, itaconic acid, or hydroxyalkyl (meth)acrylic such as 2-hydroxyethyl (meth)acrylate or 4-hydroxybutyl (meth)acrylate with an acid anhydride such as maleic anhydride, succinic anhydride, or phthalic anhydride, a vinyl-based monomer having a carboxyl group such as acrylic acid, methacrylic acid, carboxylalkyl(meth)acrylate (e.g., carboxylethyl(meth)acrylate, carboxylpentyl(meth)acrylate), and the like; a vinyl-based monomer having a sulfonic acid group such as vinyl sulfonic acid, styrene sulfonic acid, allyl sulfonic acid, 2-methylpropyl sulfonic acid (meth)acrylate, dimethylpropyl sulfonic acid (meth)acrylate, sulfonic acid ethyl(meth)acrylate, and the like; and a vinyl-based monomer having a phosphoric acid group such as (meth)acryloyloxyethyl phosphate ester and 2-hydroxyethyl (meth)acryloyl phosphate.

Specific examples of the second vinyl-based monomer may be hydroxyalkyl(meth)acrylate such as 2-hydroxyethyl (meth)acrylate, 2-hydroxypropyl(meth)acrylate, 2-hydroxybutyl(meth)acrylate, 3-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, (4-hydroxymethylcyclohexyl)methyl(meth) acrylate, and the like; alkoxy(meth)acrylate such as n-butoxyethyl(meth)acrylate, butoxydiethylene glycol(meth)acrylate, methoxytriethylene glycol(meth)acrylate, methoxynonylethylene glycol(meth)acrylate, and the like.

Specific examples of the third vinyl-based monomer may be (meth)acrylic acid (e.g., C1 to C20, C4 to C20 or C4 to C15) alkylester such as methyl(meth)acrylate, ethyl(meth)acrylate, propyl(meth)acrylate, n-butyl(meth)acrylate, isobutyl(meth)acrylate, sec-butyl(meth)acrylate, t-butyl(meth)acrylate, pentyl(meth)acrylate, isopentyl(meth)acrylate, hexyl(meth)acrylate, 2-ethylhexyl(meth)acrylate, heptyl(meth)acrylate, octyl(meth)acrylate, isooctyl(meth)acrylate, nonyl(meth)acrylate, isononyl(meth)acrylate, decyl(meth)acrylate, isodecyl(meth)acrylate, n-lauryl(meth)acrylate, undecyl(meth)acrylate, dodecyl(meth)acrylate, n-tridecyl(meth)acrylate, pentadecyl(meth)acrylate, cesyl(meth)acrylate, heptadecyl(meth)acrylate, isooctadecyl (meth)acrylate, nonadecyl(meth)acrylate, eicosyl (meth)acrylate, stearyl (meth)acrylate, and the like; (meth)acrylate having a (e.g., C4 to C20, C5 to C20 or C4 to C15) cycloalkyl group such as cyclobutyl(meth)acrylate, cyclopentyl (meth)acrylate, cyclohexyl (meth)acrylate, methylcyclohexyl (meth)acrylate, cyclododecyl (meth)acrylate, isobornyl (meth)acrylate, dicyclopentyl(meth)acrylate, and the like; or (meth)acrylate having a (e.g., C6 to C20 or C6 to C15) aryl group such as benzyl(meth)acrylate, phenyl(meth)acrylate, phenoxyethyl (meth)acrylate, and the like.

The chain transfer agent may be a compound represented by Chemical Formula 4, and specifically, trithiocarbonate, dithiocarbonate, xanthate-based material may be used.

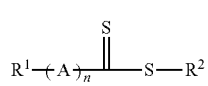

[Chemical Formula 4]

In Chemical Formula 4,
A is O or S,
n is 0 or 1,
$R^1$ and $R^2$ are independently selected from a C1 to C20 alkyl group; a C2 to C20 alkenyl group; saturated or unsaturated hydrocarbon cyclic group (having 5 to 15 cyclic atoms) or saturated or unsaturated heterohydrocarbon cyclic group (having 5 to 15 cyclic atoms); a C6 to C20 aryl group or a C3 to C20 heteroaryl group; a C1 to C20 alkoxy group; a C2 to C20 dialkylamino group, and a carboxyl group, and the C1 to C20 alkyl group, C2 to C20 alkenyl group, saturated or unsaturated hydrocarbon cyclic group (having 5 to 15 cyclic atoms), or saturated or unsaturated heterohydrocarbon cyclic group (having 5 to 15 cyclic atoms), C6 to C20 aryl group, C3 to C20 heteroaryl group, C1 to C20 alkoxy group and C2 to C20 dialkylamino group may be substituted with a substituent selected from an epoxy group, a hydroxy group, a C1 to C20 alkoxy group, a C6 to C20 aryl group, an acyl group, an acyloxy group, a carboxyl group and a salt thereof, a sulfonic acid group and a salt thereof, a C2 to C20 alkylcarbonyloxy group, an isocyanato group, a cyano group, a silyl group, a halogen, and a C2 to C20 dialkylamino group.

Specific examples of the chain transfer agent may be dibenzyl trithiocarbonate (DBTTC), benzyl dithiobenzoate, cumyl dithiobenzoate, 1-phenylethyl dithiobenzoate, S-(thiobenzoyl)thioglycolic acid, ethyl dithioacetate or alkali metal salts thereof.

In some example embodiments, the chain transfer agent may be used in an amount of about 0.01 to about 10 parts by weight based on 100 parts by weight of the total monomer mixture. For example, the chain transfer agent used in an amount of greater than or equal to about 0.02 parts by weight, greater than or equal to about 0.03 parts by weight, greater than or equal to about 0.04 parts by weight, or greater than or equal to about 0.05 parts by weight, and less than or equal to about 9.5 parts by weight, less than or equal to about 9 parts by weight, less than or equal to about 8.5 parts by weight, or less than or equal to about 8 parts by weight. When the chain transfer agent is used in the above range, a molecular weight distribution may be effectively controlled, and a polymerization rate may be adjusted to a desired range.

The living free radical initiator may be, for example, one or more selected from oxygen, hydroperoxide, perester, percarbonate, peroxide, persulfate, and an azo-based initiator, and more specifically hydrogen peroxide, t-butyl hydroperoxide, tertiary amyl hydroperoxide, azodiisobutyronitrile (AIBN), potassium persulfate and methylethyl ketone peroxide may be used.

The living free radical initiator may be used in an amount of about 0.01 to about 5 parts by weight based on 100 parts by weight of the vinyl-based monomer. For example, the living free radical initiator may be used in an amount of greater than or equal to about 0.02 parts by weight, greater than or equal to about 0.03 parts by weight, greater than or equal to about 0.04 parts by weight, or greater than or equal to about 0.05 parts by weight and less than or equal to about 4.5 parts by weight, less than or equal to about 4.0 parts by weight, less than or equal to about 3.5 parts by weight, or less than or equal to about 3 parts by weight. Within the above range, a polymerization reaction rate may be appropriately controlled, and a block copolymer having a molecular weight distribution (PDI) close to 1 may be prepared.

The composite for sensing heat or infrared light may further include a reinforcing agent for improving mechanical properties. The reinforcing agent may include graphite, carbon nanotubes, graphene, graphite nanoplates, fullerene, fullerene derivatives, quantum dots, metal oxides (e.g., silica, alumina ($Al_2O_3$), titania ($TiO_2$), zirconia ($ZrO_2$), ZnO, $SnO_2$, $Sb_2O_3$, boehmite, indium tin oxide (ITO), etc.), or a combination thereof. In some example embodiments, the reinforcing agent may desirably have a spherical shape.

For example, the quantum dots may include a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof.

The reinforcing agent may be dispersed in the polymer network of the block copolymer.

The reinforcing agent may be present (e.g., included) in the composite in an amount of greater than or equal to about 0.1 volume %, for example greater than or equal to about 0.2 volume %, greater than or equal to about 0.3 volume %, greater than or equal to about 0.4 volume %, or greater than or equal to about 0.5 volume % based on a total volume of the composite for sensing heat or infrared light. The reinforcing agent may be present in the composite in an amount of less than or equal to about 5 volume %, for example less than or equal to about 4.5 volume %, less than or equal to about 4.0 volume %, less than or equal to about 3.5 volume %, or less than or equal to about 3.0 volume % based on a total volume of the composite for sensing heat or infrared light. In the above ranges, it is possible to improve the electrical properties of the composite for sensing heat or infrared light.

The composite for sensing heat or infrared light may be produced in a thin film form. The thin film may be produced based on a process in which a block copolymer and a salt of a polyvalent metal are mixed in a solvent to obtain a composition, and the composition is coated on a substrate and then dried.

The solvent may be water; a monovalent alcohol such as methanol, ethanol, propanol, isopropanol, n-butanol, sec-butanol, t-butanol, 2-ethylhexanol, heptanol, octanol, nonanol, dodecanol, and the like; polyhydric alcohol such as ethylene glycol, propylene glycol, butylene glycol, hexyleneglycol, dipropylene glycol, polyethylene glycol, polypropylene glycol, glycerol, and the like.

The salt of the polyvalent metal may include halides, carboxylates, acetylacetonates, hydroxides, nitrates, sulfates, or combinations thereof including a polyvalent metal, but is not limited thereto. The polyvalent metal may be a divalent or trivalent metal. Specific examples of the polyvalent metal include Ca, Al, Cu, Co, Ba, Zn, Fe, Mn, Mg, Sr, Ba, Cr, Ti, Zr, Mo, V, or a combination thereof.

The substrate may be, for example, a glass substrate or a polymer substrate, and the polymer substrate may be made of, for example, polyethylene terephthalate, polyethylene naphthalate, polycarbonate, polyacrylate, polyimide, or a combination thereof, but is not limited thereto.

The coating of the composition on the substrate may be performed, for example, based on spin coating, slit coating, bar coating, dip coating, spray coating, inkjet printing, etc., but is not limited thereto. In some example embodiments, the composition may be coated, for example, based on spin coating.

The thin film may be transferred on an elastic substrate (e.g. SEBS), for example, based on contacting the thin film with the elastic substrate to transfer it thereon and then, removing the elastic substrate.

The aforementioned composite for sensing heat or infrared light has excellent flexibility, stretchability, and the like, excellent charge mobility and electrical conductivity, and excellent absorption in a long wavelength region, for example, in an infrared region of about 1 micrometer (μm) to about 20 micrometers (μm). Accordingly, the composite for sensing heat or infrared light may be used as an infrared absorber and thus applied to a photoelectric device and an organic sensor which sense infrared light. For example, the thin film-shaped composite for sensing heat or infrared light may be applied as a charge transport layer and/or an active layer or an infrared light absorption film in the photoelectric device and the organic sensor.

In addition, the aforementioned composite for sensing heat or infrared light may be applied to an electronic device such as a thin film transistor, a photodetector, a solar cell, an organic light emitting diode (OLED) display, and the like.

In addition, the composite for sensing heat or infrared light has improved temperature responsivity and may be applied as a thermal sensing conversion film of a thermal sensing device and a sensor including the same. Herein, since no cooler is needed to improve temperature responsivity, a thermal sensing device and a sensor manufactured based on applying the same may be down-sized.

In addition, the electronic device may be a stretchable organic light emitting diode (OLED), a stretchable human motion sensor, a stretchable artificial muscle, or a stretchable actuator.

Hereinafter, an example of a thin film transistor including the composite for sensing heat or infrared light is described with reference to FIG. 2.

Figure 2:
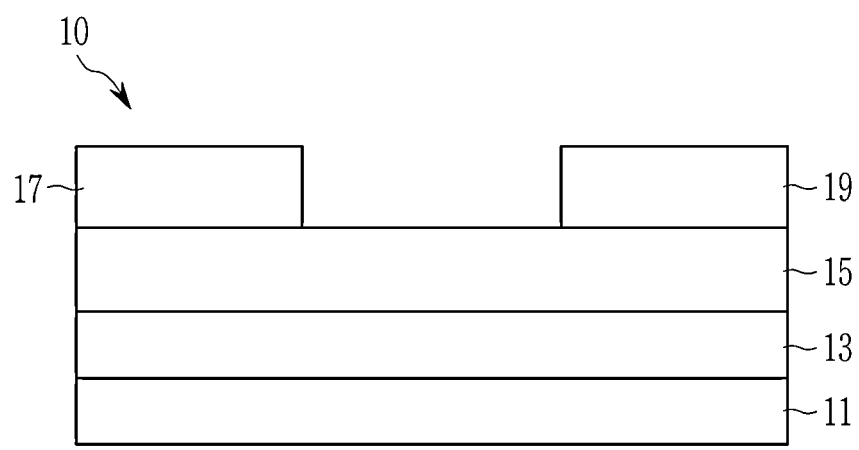
FIG. 2 is a schematic cross-sectional view showing a thin film transistor according to some example embodiments.

FIG. 2 is a schematic cross-sectional view showing a thin film transistor according to some example embodiments.

Referring to FIG. 2, a thin film transistor 10 includes a substrate 11, an insulation layer 13, a semiconductor layer 15, a source electrode 17, and a drain electrode 19.

The substrate 11 may include a gate electrode or serve as a gate electrode as a whole. The substrate 11 may be made of transparent glass, silicon, or plastic. The gate electrode may be formed through internal doping of the silicon substrate at a high concentration or a conductive layer (e.g., a metal layer or a CNT layer formed of gold (Au), copper (Cu), nickel (Ni), aluminum (Al), molybdenum (Mo), chromium (Cr), tantalum (Ta), titanium (Ti), an alloy thereof, or a combination thereof) disposed on an insulating substrate (e.g., a rubber such as PDMS, SEBS, and the like and a polymer substrate such as polyester, polycarbonate, polyimide, and the like).

The insulation layer 13 is disposed on the substrate 11. The insulation layer 13 separates the gate electrode, the source electrode 17, the drain electrode 19, and the semiconductor layer 15. The insulation layer 13 may be an inorganic material thin film or an organic polymer film. Examples of the inorganic material may include silicon oxide, silicon nitride, aluminum oxide, barium titanate, and the like, but are not limited thereto. Examples of the organic polymer include polyester, polycarbonate, poly(vinyl phenol), polyimide, polystyrene, poly(methacrylate), poly(acrylate), an epoxy resin, and the like, but are not limited thereto. In addition, when the thin film including the composite for sensing heat or infrared light is transferred on the elastic substrate, the elastic substrate may play a role of an insulation layer. In some example embodiments, the insulation layer 13 may include a thin film that includes the aforementioned composite.

A thickness of the insulation layer 13 may vary depending on a dielectric constant of an insulating material but is not particularly limited. For example, the insulation layer 13 may have a thickness of greater than or equal to about 10 nm, for example, greater than or equal to about 50 nm, or greater than or equal to about 100 nm, but is not limited thereto. The insulation layer 13 may have a thickness of less than or equal to about 2000 nm, for example, less than or equal to about 500 nm, but is not limited thereto. The insulation layer 13 may have conductivity of less than or equal to about 10-12 S/cm, but is not limited thereto.

On the insulation layer 13, the semiconductor layer 15 is disposed and may include the aforementioned composite for sensing heat or infrared light. In some example embodiments, the semiconductor layer 15 may be a thin film that includes the aforementioned composite.

On the semiconductor layer 15, the source electrode 17 and the drain electrode 19 electrically connected to the semiconductor layer 15 are disposed.

Examples of materials for the source electrode 17 and the drain electrode 19 include a metal such as gold (Au), copper (Cu), nickel (Ni), aluminum (Al), molybdenum (Mo), chromium (Cr), tantalum (Ta), titanium (Ti), an alloy thereof, and the like, a conductive polymer, and a conductive ink, but are not limited thereto. Thicknesses of the source electrode 17 and drain electrode 19 may be appropriately determined.

Herein, the thin film transistor may, for example, have a top contact/bottom gate structure but is not limited thereto but equally have all other structures such as a bottom contact/top gate structure, a bottom contact/bottom gate structure, or a top contact/top gate structure.

The thin film transistor including the composite for sensing heat or infrared light may be used as a heat-sensing sensor measuring a temperature of an object. In other words, when heat is applied to the thin film transistor 10, and a voltage is applied to the gate electrode, charge mobility of the semiconductor layer 15 is increased, and resistance of the source electrode 17 and the drain electrode 19 is decreased, and accordingly, a drain current flowing between the source electrode 17 and the drain electrode 19 is increased. On the contrary, when the heat is removed from thin film transistor 10, the drain current flowing between the source electrode 17 and the drain electrode 19 is decreased. Accordingly, since electrical signal strength of the thin film transistor 10 is changed depending on a temperature, the thin film transistor 10 may work as a heat sensor or a thermal sensing device.

The thin film transistor including the composite for sensing heat or infrared light may work as a switching element or a driving element of various electronic devices. In some example embodiments, the electronic devices may be stretchable electronic devices. For example, the electronic devices may be stretchable organic light emitting diode (OLED) displays, stretchable human motion sensors, stretchable artificial muscles, prosthetics, or stretchable actuators.

In some example embodiments, the aforementioned composite for sensing heat or infrared light may be applied to (e.g., included in) a photoelectric device.

Hereinafter, a photoelectric device according to some example embodiments is described with reference to FIG. 3.

Figure 3:
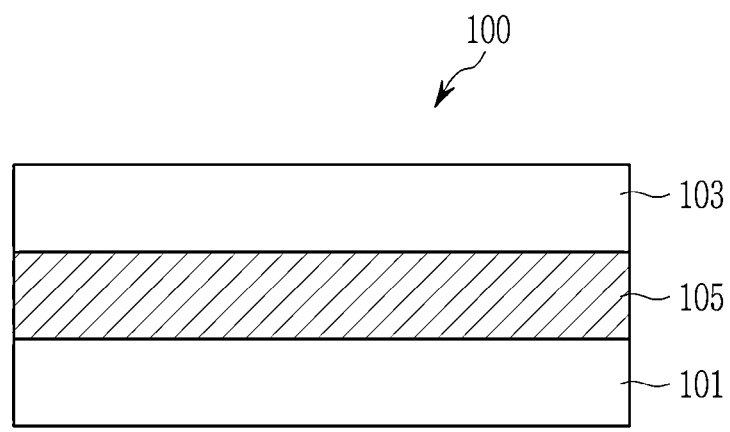
FIG. 3 is a cross-sectional view showing a photoelectric device according to some example embodiments.

FIG. 3 is a cross-sectional view showing a photoelectric device according to some example embodiments.

Referring to FIG. 3, a photoelectric device 100 according to some example embodiments includes a first electrode 101 and a second electrode 103 facing each other, and an active layer 105 between the first electrode 101 and the second electrode 103.

One of the first electrode 101 or the second electrode 103 may be an anode, and the other may be a cathode. One of the first electrode 101 or the second electrode 103 may be a light-transmitting electrode, and the light-transmitting electrode may be made of, for example, a transparent conductor such as indium tin oxide (ITO) or indium zinc oxide (IZO), or a metal thin layer of a thin monolayer or a multilayer. When one of the first electrode 101 or the second electrode 103 is an opaque electrode, it may be made of an opaque conductor such as aluminum (Al).

The active layer 105 may include the aforementioned composite.

The photoelectric device 100 may further include a photoelectric conversion layer including a p-type semiconductor compound and an n-type semiconductor compound on or under the active layer 105. In some example embodiments, the photoelectric conversion layer may include the active layer 105.

The photoelectric conversion layer is a layer including a p-type semiconductor compound and an n-type semiconductor compound to form a bulk heterojunction (BHJ), which receives light from outside to generate excitons, and then separates the generated excitons into holes and electrons.

Hereinafter, a photoelectric device according to some example embodiments is described with reference to FIG. 4.

Figure 4:
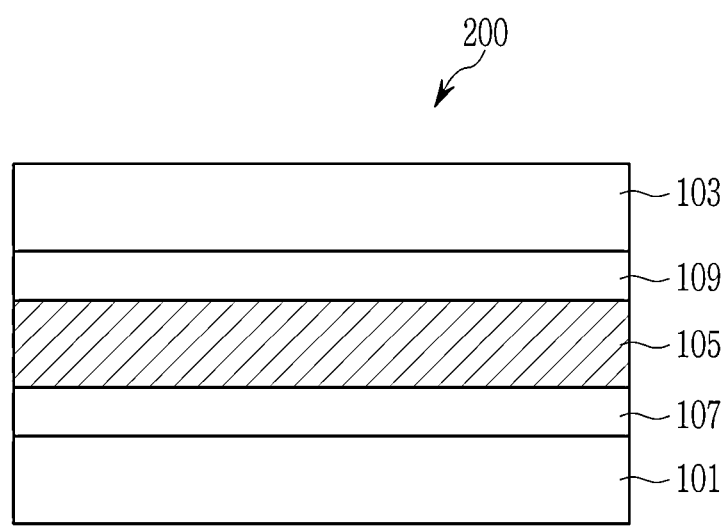
FIG. 4 is a cross-sectional view showing a photoelectric device according to some example embodiments.

FIG. 4 is a cross-sectional view showing a photoelectric device according to some example embodiments.

Referring to FIG. 4, a photoelectric device 200 according to some example embodiments includes a first electrode 101 and a second electrode 103 facing each other, and an active layer 105 between the first electrode 101 and the second electrode 103, as in the photoelectric device shown in FIG. 3.

However, in the photoelectric device 200 according to some example embodiments, unlike some example embodiments, including the example embodiments shown in FIG. 2, the charge auxiliary layers 107 and 109 may be disposed between the first electrode 101 and the active layer 105 and between the second electrode 103 and the active layer 105, respectively. The charge auxiliary layers 107 and 109 may make holes and electrons separated in the active layer 105 be transported easily to improve efficiency.

The charge auxiliary layers 107 and 109 may include at least one selected from a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, and a hole blocking layer (HBL) for preventing hole transport.

The charge auxiliary layers 107 and 109 may include, for example, an organic material, an inorganic material, or an organic/inorganic material. The organic material may be an organic material having hole or electron characteristics and the inorganic material may be for example a metal oxide such as a molybdenum oxide, a tungsten oxide, or a nickel oxide.

One of the charge auxiliary layers 107 and 109 may be omitted.

The photoelectric device further includes a photoelectric conversion layer including a p-type semiconductor compound and an n-type semiconductor compound between the active layer 105 and the charge auxiliary layer 107 and/or between the active layer 105 and the charge auxiliary layer 109.

In some example embodiments, the active layer 105 may include the composite.

The photoelectric device 100 and/or 200 may be applied to (e.g., included in) an organic cell, a solar cell, an image sensor, a photodetector, and a photosensor, but is not limited thereto.

The organic sensor may be an organic CMOS sensor, for example an organic CMOS infrared light sensor or an organic CMOS image sensor.

Figure 5:
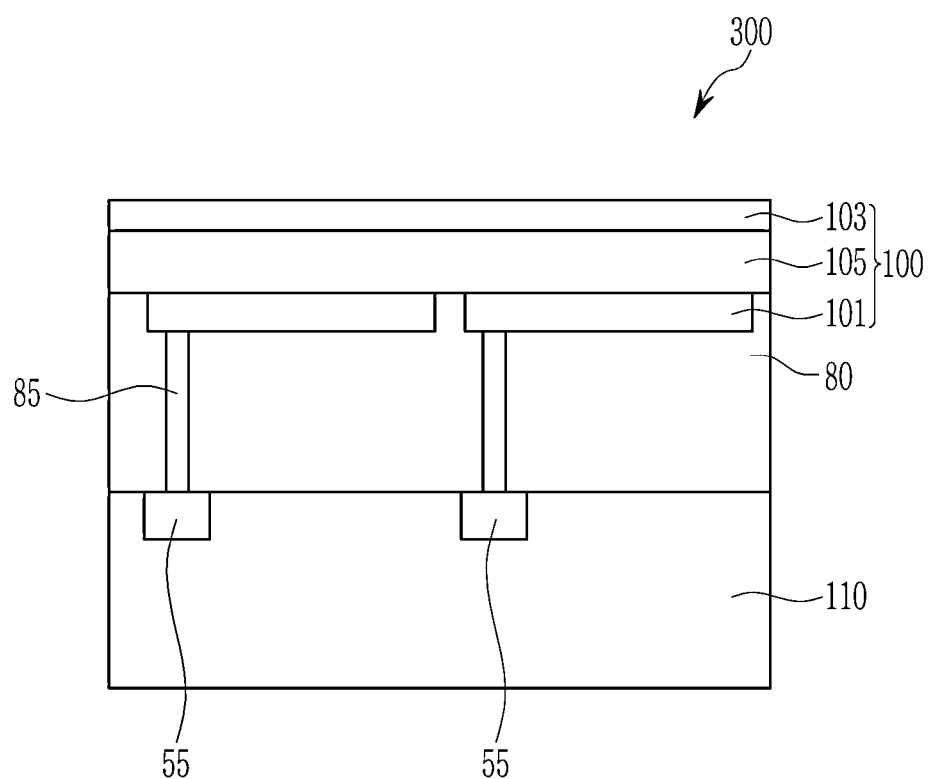
FIG. 5 is a cross-sectional view showing an example of an organic sensor according to some example embodiments.

FIG. 5 is a cross-sectional view showing an example of an organic sensor according to some example embodiments.

The organic sensor 300 according to some example embodiments includes a semiconductor substrate 110, an insulation layer 80, and a photoelectric device 100.

The semiconductor substrate 110 may be a silicon substrate and is integrated with a transmission transistor (not shown) and a charge storage 55. The charge storage 55 may be integrated in each pixel. The charge storage 55 is electrically connected to the photoelectric device 100 that will be described later and information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the semiconductor substrate 110.

The insulation layer 80 is formed on the metal wire and pad. The insulation layer 80 may be made of an inorganic insulating material such as a silicon oxide and/or a silicon nitride, or a low dielectric constant (low K) material such as SiC, SiCOH, SiCO, and SiOF. The insulation layer 60 has a trench 85 exposing the charge storage 55. The trench 85 may be filled with fillers.

The aforementioned photoelectric device 100 is formed on the insulation layer 80. As described above, the photoelectric device 100 includes a first electrode 101, a second electrode 103, and an active layer 105.

In some example embodiments, the active layer 105 may include the composite.

The first electrode 101 and the second electrode 103 may both be transparent electrodes, and the active layer 105 is the same as described above. The active layer 105 may selectively absorb light in the infrared wavelength range. The light incident from the second electrode 103 side may have high absorbance characteristics in the infrared wavelength range based on the active layer 105, and thus, may exhibit good photoelectric conversion characteristics.

FIG. 5 illustrates an example including the photoelectric device of FIG. 3, but is not limited thereto, and may include the photoelectric device of FIG. 4.

Focusing lens (not shown) may be further formed on the photoelectric device 100. The focusing lens may control a direction of incident light and gather the light in one region. The focusing lens may have a shape of, for example, a cylinder or a hemisphere, but is not limited thereto.

The organic sensor according to some example embodiments may be an organic infrared light sensor, for example an iris sensor or a depth sensor.

The iris sensor identifies a person based on using unique iris characteristics of every person and specifically, taking an image of an eye of a user within an appropriate distance, processing the image, and comparing it with his/her stored image.

The depth sensor identifies a shape and a location of an object from its three-dimensional information based on taking an image of the object within an appropriate distance with a user and processing the image. This depth sensor may be, for example, used as a face recognition sensor.

Figure 6:
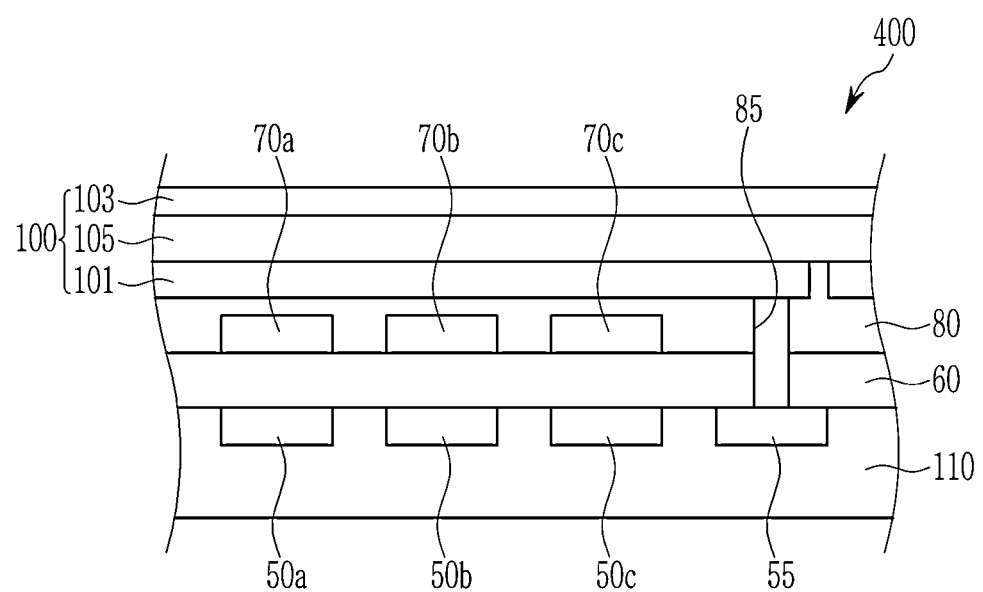
FIG. 6 is a cross-sectional view showing an organic sensor according to some example embodiments.

FIG. 6 is a cross-sectional view showing an example of an organic sensor according to some example embodiments.

An organic sensor according to some example embodiments may be an organic CMOS image sensor.

Referring to FIG. 6, an organic sensor 400 according to some example embodiments includes a semiconductor substrate 110 integrated with photo-sensing devices 50a, 50b, and 50c, a transmission transistor (not shown), and a charge storage 55, a lower insulation layer 60, color filters 70a, 70b, and 70c, an upper insulation layer 80, and a photoelectric device 100.

The semiconductor substrate 110 may be integrated with photo-sensing devices 50a, 50b, and 50c, a transmission transistor (not shown), and a charge storage 55. The photo-sensing devices 50a, 50b, and 50c may be photodiodes.

The photo-sensing devices 50a, 50b, and 50c, the transmission transistor, and/or the charge storage 55 may be integrated in each pixel. For example, the photo-sensing device 50a may be included in a red pixel, the photo-sensing device may be included in a green pixel, and the photo-sensing device 50c may be included in a blue pixel.

The photo-sensing devices 50a, 50b, and 50c sense light, the information sensed by the photo-sensing devices may be transferred by the transmission transistor, the charge storage 55 is electrically connected to the photoelectric device 100 (also referred to herein as a photoelectric diode) that will be described later, and the information of the charge storage 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing devices 50a and 50b.

The lower insulation layer 60 is formed on the metal wire and the pad.

Color filters 70a, 70b, and 70c are formed on the lower insulation layer 60. The color filters 70a, 70b, and 70c includes a red filter 70a formed in a red pixel, a green filter 70b formed in a green pixel, and a blue filter 70c formed in a blue pixel.

The upper insulation layer 80 is formed on the color filters 70a, 70b, and 70c. The upper insulation layer 80 eliminates steps caused by the color filters 70a, 70b, and 70c and planarizes the surface. The upper insulation layer 80 may have a same material composition as the insulation layer 80 of the organic sensor 300 shown in FIG. 5.

The aforementioned photoelectric device 100 is formed on the upper insulation layer 80. As described above, the photoelectric device 100 includes a first electrode 101, an active layer 105, and a second electrode 103. Even though a structure in which the first electrode 101, the active layer 105, and the second electrode 103 are sequentially stacked is shown as an example in the drawing, the present disclosure is not limited to this structure, and the second electrode 103, the active layer 105, and the first electrode 101 may be arranged in this order.

FIG. 6 illustrates an example including the photoelectric device of FIG. 3, but is not limited thereto, and may include the photoelectric device of FIG. 4.

In some example embodiments, one or more, or all (e.g., any) of the elements 110, 50a-50c, 55, 60, 80, 85, 70a-70c, 101, 103, 105, 110 of organic sensor 400 may include the composite. For example, the active layer 105 may include the composite.

The first electrode 101 and the second electrode 103 may both be transparent electrodes, and the active layer 105 is the same as described above. The active layer 105 may selectively absorb light in an infrared wavelength region.

Incident light from the side of the second electrode 103 may be photoelectrically converted based on mainly absorbing light in an infrared wavelength region in the active layer 105. Light in the remaining wavelength region may pass through the first electrode 101 and the color filters 70a, 70b, and 70c, the light in a red wavelength region passing through the color filter 70a may be sensed by the photo-sensing device 50a, the light in a green wavelength region passing through the color filter 70b may be sensed by the photo-sensing device 50b, and the light in a blue wavelength region passing through the color filter 70c may be sensed by the photo-sensing device 50c.

The aforementioned organic sensor may be applied to various electronic devices, for example and the electronic devices may include for example a camera, a camcorder, a mobile phone internally having them, a display device, a security device, or a medical device, but are not limited thereto. Accordingly, in some example embodiments, an electronic device may include the composite.

Hereinafter, the embodiments are illustrated in more detail with reference to examples. However, the example embodiments are not limited to these examples.

EXAMPLES

Synthesis Example 1: Preparation of Block Copolymer

A starting material and a reagent are purchased from Sigma Aldrich Co., Ltd. and purged with nitrogen to remove oxygen before a reaction.

First, as shown in Reaction Scheme 1-1, 2-hydroxyethyl acrylate (1.16 g, 10 mmole) and t-butyl acrylate (1.28 g, 10 mmole) are mixed in a mole ratio of 1:1, and S,S-dibenzyl trithiocarbonate (29 mg, 0.1 mmole) is added thereto and then, purged with nitrogen for 5 minutes. Herein, azodiisobutyronitrile (AIBN) is added thereto and then, stirred at 75° C. under a nitrogen atmosphere. When the reaction proceeds about 75%, gas inside the reactor is discharged to block free radicals therein and cooled down to room temperature. Non-reacted 2-hydroxyethyl acrylate and t-butyl acrylate are vacuum-removed to obtain Intermediate of yellow oil (Mw: 162, Yield: 80%).

[Reaction Scheme 1-1]

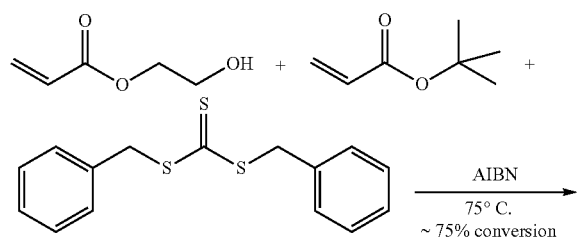

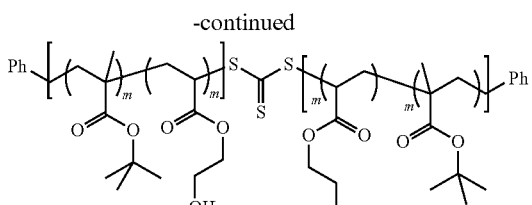

Intermediate

As shown in Reaction Scheme 1-2, Intermediate obtained in Reaction Scheme 1-1, n-butyl acrylate (6.4 g, 50 mmole), and AIBN are put and then, polymerized under a nitrogen atmosphere at 75° C. for about 1 hour. When the reaction proceeds about 75%, gas inside the reactor is discharged and then, cooled down to room temperature to obtain Polymer A.

[Reaction Scheme 1-2]

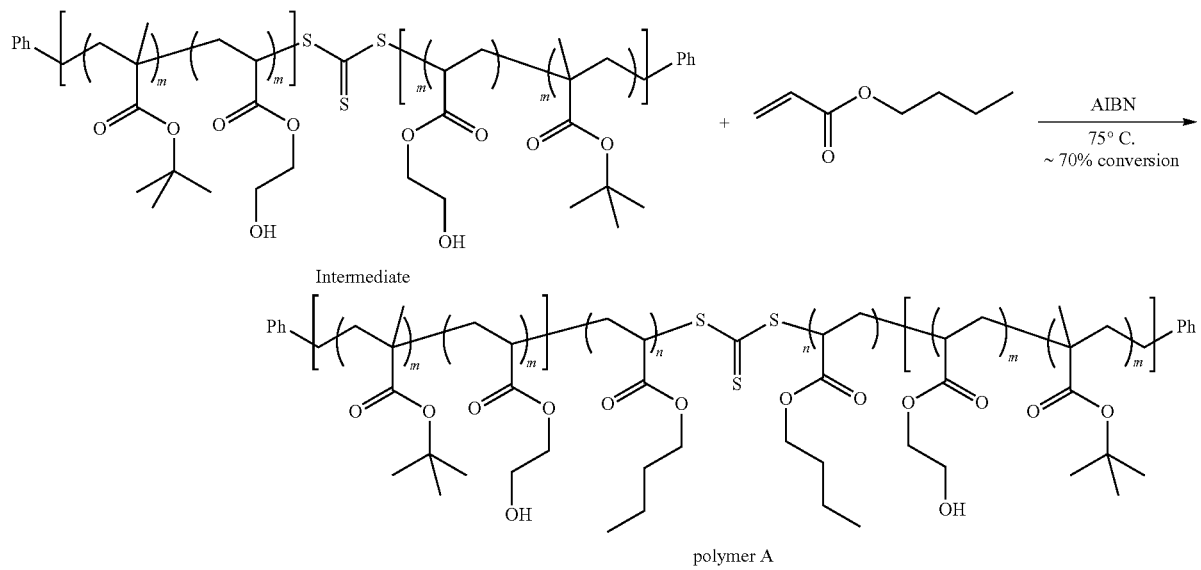

As shown in Reaction Scheme 1-3, Polymer A is maintained in a mixed solution of dichloromethane (DCM) and trifluoroacetic acid (TFA) (a volume ratio of 1:1, 100 ml) for 2 hours to remove a t-butyl group and thus prepare an ABA block copolymer (a final polymer).

[Reaction Scheme 1-3]

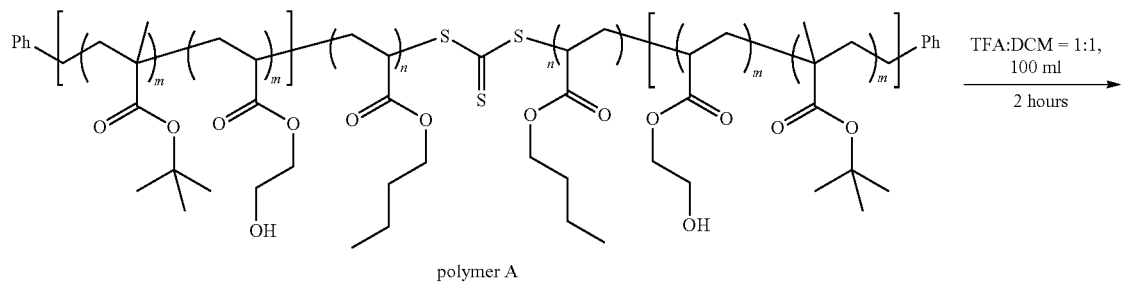

-continued

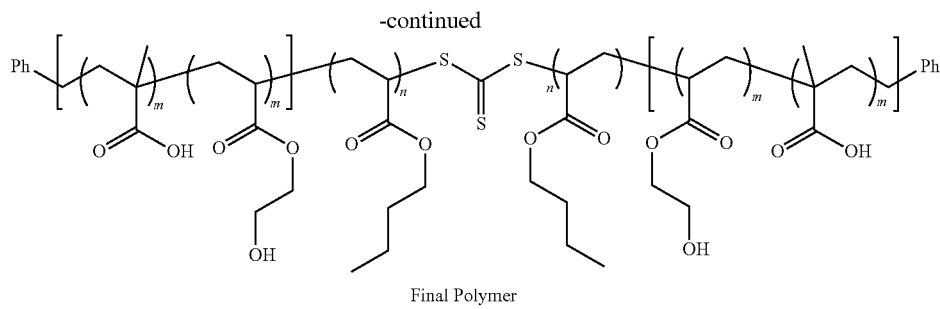

Final Polymer

Example 1-1: Production of Thin Film 99.9 ml of the block copolymer obtained in Synthesis Example 1 is dissolved in ethanol at a concentration of 2 wt % and then, stirred at 80° C. until a uniform solution is obtained. A 0.3 M CaCl$_2$) ethanol solution is prepared. The block copolymer solution is injected into a mold, and 172.8 ml of the CaCl$_2$) ethanol solution is added thereto for gelation. After the gelation reaction, a thin film obtained therefrom is dried at room temperature overnight.

Examples 1-2 to 1-4: Production of Thin Film

Thin films are formed according to the same method as Example 1-1 except that the CaCl$_2$) ethanol solution is used in each amount of 86.4 ml, 43.2 ml, and 17.3 ml.

Examples 2-1 to 2-4: Production of Thin Film

Thin films are formed according to the same method as Example 1-1 except that a 0.3 M CoCl$_2$ ethanol solution is used in each amount of 200.1 ml, 100.05 ml, 50.03 ml, and 20.01 ml instead of the CaCl$_2$) ethanol solution.

Examples 3-1 to 3-4: Production of Thin Film

Thin films are formed according to the same method as Example 1-1 except that the 0.3 M CuCl$_2$ ethanol solution is respectively used in each amount of 207.2 ml, 103.6 nil, 51.8 ml, and 20.7 ml instead of the CaCl$_2$) ethanol solution.

Examples 4-1 to 4-4: Production of Thin Films 99.9 ml of the block copolymer according to Synthesis Example 1 is dissolved in ethanol at a concentration of 2 wt % at 80° C. and then, stirred until a uniform solution is obtained. Graphite is dispersed in glycerol to prepare graphite dispersion. A 0.3 M CaCl$_2$) ethanol solution is prepared. The graphite dispersion is mixed with the CaCl$_2$) ethanol solution to prepare a mixture. A used amount of the graphite is controlled to be 0.1 volume % in a final thin film. The CaCl$_2$) ethanol solution is used in each amount of 172.8 ml, 86.4 ml, 43.2 ml, and 17.28 ml. The block copolymer solution is injected into a mold, and the mixture is added thereto for gelation. After the gelation reaction, thin films obtained therefrom are dried at room temperature overnight.

Example 4-5: Production of Thin Film

A thin film is formed according to the same method as Example 4-1 except that the amount of graphite is controlled to be 1 volume % in a final film.

Comparative Example 1: Production of Thin Film

Vanadium oxide is deposited to form a thin film.

Comparative Example 2: Production of Thin Film

Polyvinyl alcohol is dispersed in water at a concentration of 1.5 wt % and then, coated and dried to form a thin film.

Evaluations

Evaluation 1: Infrared Absorption

Figure 7:
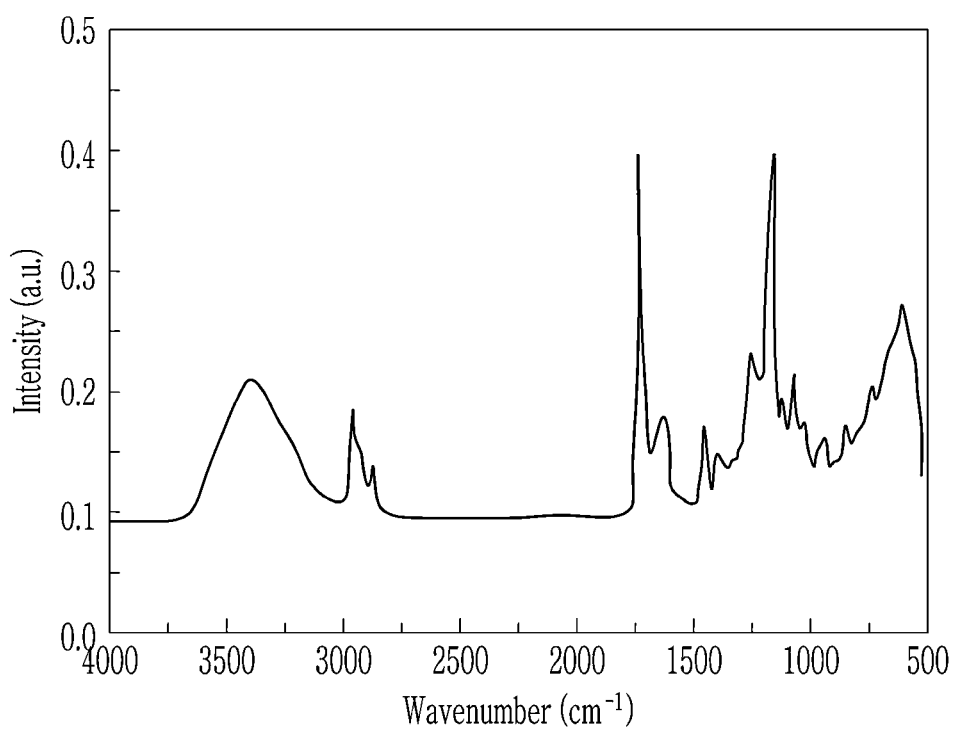
FIG. 7 is a graph showing infrared absorption of the thin film according to Example 1-1.

Absorptions of the thin films according to Examples 1-1 to 4-5 are evaluated by using a FT-IR spectrometer. The absorption of the thin film according to Example 1-1 is shown in FIG. 7. FIG. 7 is a graph showing an infrared absorption of the thin film according to Example 1-1. Referring to FIG. 7, the thin film according to Example 1-1 exhibits excellent absorption in an infrared region.

Evaluation 2: Thermal Stability of Thin Films

In order to evaluate thermal stability of the thin films according to Examples 1-1 to 1-3, a thermogravimetric analysis (TGA) is performed. Variation ratios of weight of the thin films of Examples 1-1 to 1-3 decomposed at a first decomposition temperature (210° C., $T_1$) and weights of the thin films decomposed at a second decomposition temperature (280° C., $T_2$) are calculated according to Equation 1 and then, shown in Table 1. Variation ratios of weights of the thin films of Examples 2-1 to 2-3 decomposed at a first decomposition temperature (200° C., $T_1$) and weights of the thin films decomposed at a second decomposition temperature (270° C., $T_2$) are calculated according to Equation 1 and then, shown in Table 1.

Variation ratio (%)=(($T_2-T_1$)/$T_1$)×100     [Equation 1]

In the Equation 1, Ti is the first decomposition temperature, and $T_2$ is the second decomposition temperature.

TABLE 1

|  | Variation ratio (%) |
|---|---|
| Example 1-1 | 1.78 |
| Example 1-2 | 1.67 |
| Example 1-3 | 2.04 |
| Example 2-1 | 1.53 |
| Example 2-2 | 2.39 |
| Example 2-3 | 2.16 |

Referring to Table 1, the thin films according to Examples 1-1 to 1-3 exhibit a low variation ratio of less than or equal to 2.04% between the first decomposition temperature ($T_1$) and the second decomposition temperature ($T_2$), and the thin films according to Examples 2-1 to 2-3 exhibit a low variation ratio of less than or equal to 2.39% between the first decomposition temperature ($T_1$) and the second decomposition temperature ($T_2$). Accordingly, the thin films exhibit almost no material change within a semiconductor process temperature range of 200° C. to 240° C. and thus excellent process stability.

Evaluation 3: Temperature Responsivity

The thin films according to Examples 1-1 to 4-5 and Comparative Examples 1 and 2 are individually electrically connected to carbon tapes to measure a current depending on a temperature change based on using a 2-channel source meter (Keithley 2636B).

Figure 8A:
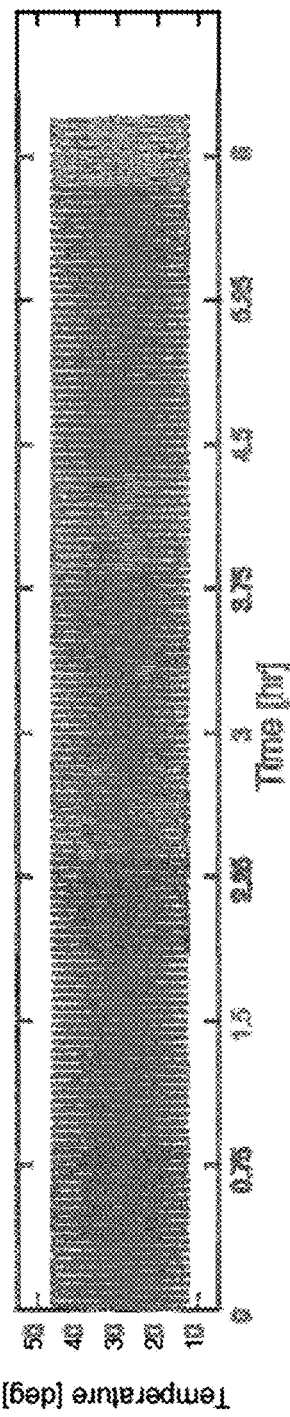
FIG. 8A is a view showing a cycle of temperature change applied to a thin film according to Example 1-1.
Figure 8B:
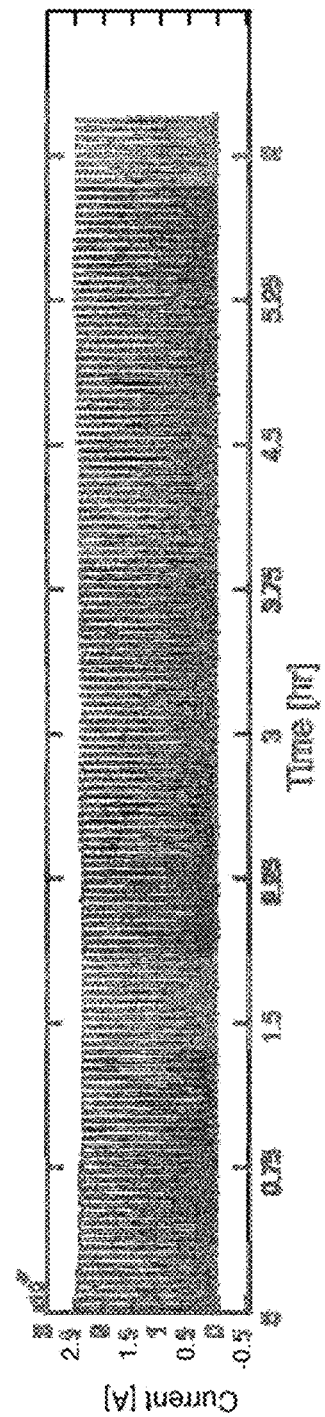
FIG. 8B is a view showing a current detected in the thin film according to Example 1-1.

A temperature change of the thin film according to Example 1-1 and a current detected in the thin film, when 40000 cycles of temperature changes are performed, are measured and respectively shown in FIGS. 8A and 8B. FIG. 8A is a view showing a cycle of temperature change applied to a thin film according to Example 1-1, and FIG. 8B is a view showing a current detected in the thin film according to Example 1-1. Referring to FIGS. 8A and 8B, the same current curve as the temperature change cycle is detected, and accordingly, the thin film of Example 1 exhibits excellent current detection intensity depending on a temperature change.

The thin films of Examples 1-1 to 4-5 and Comparative Examples 1 and 2 are respectively electrically connected to carbon tapes to measure TCR (temperature coefficient of resistance) according to temperature changes based on using a 2-channel source meter (Keithley 2636B).

Figure 9:
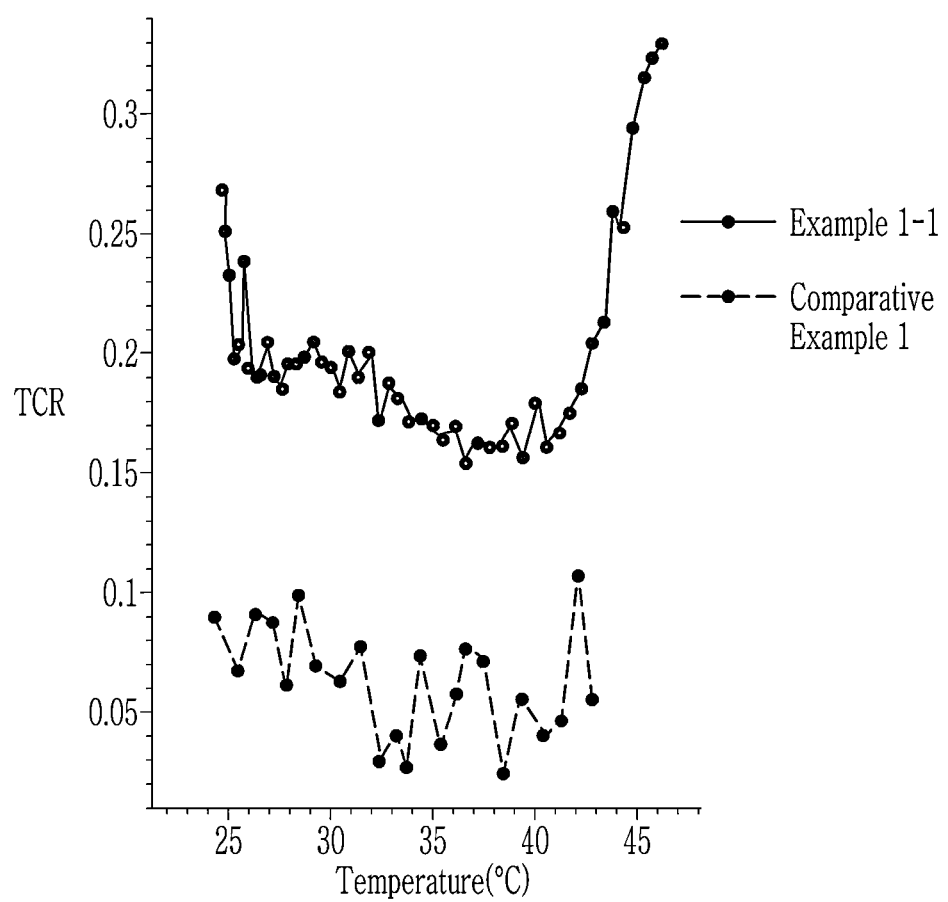
FIG. 9 is a graph showing the results of measuring temperature coefficient of resistance (TCR) according to temperature changes of the thin films according to Example 1-1 and Comparative Example 1.

TCR measurement results of the thin films of Example 1-1 and Comparative Example 1 according to temperature changes are shown in FIG. 9. FIG. 9 is a graph showing the results of measuring the TCR according to temperature changes of the thin films according to Example 1-1 and Comparative Example 1. Referring to FIG. 9, the thin film according to Example 1-1 exhibits high TCR and a constant change and thus excellent temperature responsivity, but the thin film according to Comparative Example 1 exhibits a very irregular reaction depending on a temperature.

While this disclosure has been described in connection with what is presently considered to be practical example embodiments, it is to be understood that the inventive concepts are not limited to the disclosed example embodiments. On the contrary, the inventive concepts are intended to cover various modifications and equivalent arrangements included within the spirit and scope of the appended claims.

What is claimed is:

1. A composite for sensing heat or infrared light, the composite comprising:
   a block copolymer including
      a first structural group represented by Chemical Formula 1,
      a second structural group represented by Chemical Formula 2, and
      a third structural group represented by Chemical Formula 3; and
   a polyvalent metal ion coordinated with a side chain group of the block copolymer,

[Chemical Formula 1]

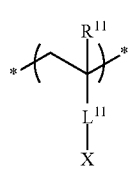

[Chemical Formula 2]

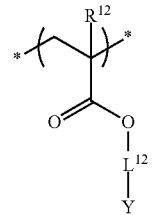

[Chemical Formula 3]

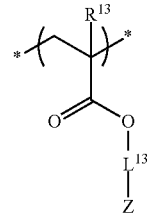

wherein, in Chemical Formulas 1 to 3,
$R^{11}$, $R^{12}$, and $R^{13}$ are independently hydrogen or a C1 to C6 alkyl group,
$L^{11}$ and $L^{12}$ are independently
   a single bond,
   a substituted or unsubstituted C1 to C10 alkylene group,
   a C2 to C20 alkylene group in which at least one methylene group is replaced by a linker selected from —O—, —S—, —C(═O)—, —S(═O)—, —S(═O)$_2$—, —C(═O)—O—, —O—C(═O)—, —C(═O)NR— wherein R is hydrogen or a C1 to C6 alkyl group, or a combination thereof, and
   a substituted or unsubstituted C6 to C10 arylene group,
$L^{13}$ is selected from a single bond, a substituted or unsubstituted C1 to C20 alkylene group, a substituted or unsubstituted C3 to C20 cycloalkylene group, and a substituted or unsubstituted C6 to C20 arylene group,
X is a carboxyl group (—COOH), a sulfonic acid group ((—S(═O)$_2$OH), or a phosphoric acid group (—O—P(═O)(OH)$_2$),
Y is selected from
   a hydroxy group (—OH),
   an alkoxy group (—OR, wherein R is a linear or branched C1 to C10 alkyl group),
   an ester group (C(═O)OR, wherein R is a linear or branched C1 to C10 alkyl group),
   a sulfonate ester group (—S(═O)$_2$OR, wherein R is a linear or branched C1 to C10 alkyl group),
   a phosphoric acid ester group (—O—P(═O)(OR)$_2$, wherein R is a linear or branched C1 to C10 alkyl group),
   an amine group,
   an isocyanate group (—N═C═O), and
   a urethane group (—NHC(═O)OR, wherein R is a linear or branched C1 to C10 alkyl group), and
Z is selected from
   a substituted or unsubstituted linear or branch C1 to C20 alkyl group,
   a substituted or unsubstituted C6 to C30 aryl group,
   a substituted or unsubstituted C3 to C30 heteroaryl group, a substituted or unsubstituted C3 to C30 cycloalkyl group, and a substituted or unsubstituted C3 to C30 heterocycloalkyl group.

2. The composite of claim 1, wherein
the block copolymer includes a hydrophilic block (A) and a hydrophobic block (B)
the block copolymer further includes a linking group (L) between the hydrophilic block (A) and the hydrophobic block (B), wherein the linking group includes trithiocarbonate, dithiocarbonate, xanthate, or a combination thereof.

3. The composite of claim 2, wherein the hydrophilic block (A) and the hydrophobic block (B) are symmetrically or asymmetrically present in the block copolymer with respect to the linking group (L).

4. The composite of claim 1, wherein
the block copolymer includes a hydrophilic block (A) and a hydrophobic block (B), and
the hydrophilic block (A) includes two or more first structural groups and two or more second structural groups, wherein each structural group of the two or more first structural groups and two or more second structural groups is in a form of block copolymerization, random copolymerization, or alternating copolymerization.

5. The composite of claim 1, wherein
the block copolymer includes a hydrophilic block (A) and a hydrophobic block (B), and
the hydrophobic block (B) includes two or more third structural groups, wherein the two or more third structural groups are in a form of block copolymerization, random copolymerization or alternating copolymerization.

6. The composite of claim 1, wherein a sum amount of the first structural group and the second structural group in the block copolymer is about 2 moles to about 50 moles relative to 100 moles of the third structural group in the composite.

7. The composite of claim 1, wherein the block copolymer has a weight average molecular weight of greater than or equal to about 5,000.

8. The composite of claim 1, wherein the block copolymer is included in the composite in an amount of greater than or equal to about 20 volume % and less than or equal to about 99.9 volume % based on a total volume of the composite.

9. The composite of claim 1, wherein the block copolymer is included in the composite in an amount of greater than or equal to about 70 volume % and less than or equal to about 99 volume % based on a total volume of the composite.

10. The composite of claim 1, wherein the block copolymer is included in the composite in an amount of greater than or equal to about 20 volume % and less than or equal to about 50 volume % based on a total volume of the composite.

11. The composite of claim 1, wherein the polyvalent metal ion is a trivalent or higher metal ion.

12. The composite of claim 1, wherein the polyvalent metal ion is an ion of a metal selected from Ca, Al, Cu, Co, Ba, Zn, Fe, Mn, Mg, Sr, Ba, Cr, Ti, Zr, Mo, V, and a combination thereof.

13. The composite of claim 1, wherein the polyvalent metal ion is included in the composite in an amount of greater than or equal to about 0.1 volume % and less than or equal to about 80 volume % based on a total volume of the composite.

14. The composite of claim 1, wherein the polyvalent metal ion is included in the composite in an amount of greater than or equal to about 1 volume % and less than or equal to about 30 volume % based on a total volume of the composite.

15. The composite of claim 1, wherein the polyvalent metal ion is included in the composite in an amount of greater than or equal to about 50 volume % and less than or equal to about 80 volume % based on a total volume of the composite.

16. The composite of claim 1, further comprising:
a reinforcing agent,
wherein the reinforcing agent includes graphite, carbon nanotubes, graphene, graphite nanoplates, fullerene, fullerene derivatives, quantum dots, metal oxides, or a combination thereof.

17. The composite of claim 16, wherein the reinforcing agent is included in the composite in an amount of less than or equal to about 5 volume % based on a total volume of the composite.

18. A photoelectric device comprising the composite of claim 1.

19. A thermal sensing device comprising the composite of claim 1.

20. An electronic device comprising the composite of claim 1.

* * * * *